(12) United States Patent
Shin et al.

(10) Patent No.: US 11,954,361 B2
(45) Date of Patent: Apr. 9, 2024

(54) STORAGE DEVICE AND MEMORY SYSTEM

(71) Applicant: SAMSUNG ELECTRONICS CO., LTD., Suwon-si (KR)

(72) Inventors: Hyun Jin Shin, Hwaseong-si (KR); Do Hui Kim, Anyang-si (KR); Han Byul Choi, Hanam-si (KR)

(73) Assignee: Samsung Electronics Co., Ltd. (KR)

( * ) Notice: Subject to any disclaimer, the term of this patent is extended or adjusted under 35 U.S.C. 154(b) by 133 days.

(21) Appl. No.: 17/535,930

(22) Filed: Nov. 26, 2021

(65) Prior Publication Data

US 2022/0350534 A1    Nov. 3, 2022

(30) Foreign Application Priority Data

Apr. 29, 2021    (KR) .......................... 10-2021-0055754

(51) Int. Cl.
  *G06F 3/06*    (2006.01)
  *G11C 16/30*    (2006.01)

(52) U.S. Cl.
  CPC .......... *G06F 3/0659* (2013.01); *G06F 3/0625* (2013.01); *G06F 3/0679* (2013.01); *G11C 16/30* (2013.01)

(58) Field of Classification Search
  CPC .... G06F 3/0659; G06F 3/0625; G06F 3/0679; G11C 16/30
  USPC ...................................................... 711/154
  See application file for complete search history.

(56) References Cited

U.S. PATENT DOCUMENTS

| | | | |
|---|---|---|---|
| 6,166,960 A * | 12/2000 | Marneweck | G11C 16/225 365/228 |
| 6,373,326 B1 | 4/2002 | Tomari | |
| 7,006,385 B2 | 2/2006 | Miyazaki | |
| 7,187,600 B2 | 3/2007 | Sibigtroth et al. | |
| 9,847,134 B2 | 12/2017 | Pao | |
| 2014/0204680 A1* | 7/2014 | Kim | G11C 16/30 365/185.21 |
| 2015/0019791 A1* | 1/2015 | Yoo | G06F 12/0207 711/102 |
| 2019/0179532 A1* | 6/2019 | Tseng | G11C 7/1039 |
| 2021/0334044 A1* | 10/2021 | Harada | G11C 16/26 |

FOREIGN PATENT DOCUMENTS

| | | |
|---|---|---|
| JP | 2005321939 A2 | 11/2005 |
| KR | 20050108588 A | 11/2006 |
| KR | 20200072463 A | 6/2020 |

* cited by examiner

*Primary Examiner* — Gautam Sain

(74) *Attorney, Agent, or Firm* — Fish & Richardson P.C.

(57) ABSTRACT

A storage device including a non-volatile memory device which receives an operating command and performs an operation corresponding to the operating command, a voltage generating circuit which generates an operating voltage according to the operating command, and a flag generating circuit which receives a busy signal indicative of the non-volatile memory device performing the operation and a pump enable signal instructing pumping of the operating voltage, and outputs a flag signal based on the busy signal and the pump enable signal. The busy signal has a first level when the non-volatile memory device performs the operation, and the flag signal transitions from a second level to the first level in response to the operating voltage becoming equal to or higher than a first reference voltage while the busy signal is at the first level.

6 Claims, 29 Drawing Sheets

US 11,954,361 B2

STORAGE DEVICE AND MEMORY SYSTEM

CROSS-REFERENCE TO RELATED APPLICATION

A claim of priority under 35 U.S.C. § 119 is made to Korean Patent Application No. 10-2021-0055754 filed on Apr. 29, 2021 in the Korean Intellectual Property Office, the entirety of which in hereby incorporated by reference.

BACKGROUND

The present disclosure relates to storage devices and memory systems.

Flash memory is typically used as non-volatile memory devices in portable electronic devices and the like. With increasing use of non-volatile memory devices in automotive electronic control units in recent years, there is an increasing demand for ensuring safe and reliable operation of the non-volatile memory devices. Accordingly, there is a need to check whether program and erase operations on non-volatile memory devices responsive to commands are performed without error.

SUMMARY

Embodiments of the inventive concepts provide a storage device having improved product reliability, and a memory system having improved product reliability.

Embodiments of the inventive concepts provide a storage device including a non-volatile memory device which receives an operating command and performs an operation corresponding to the operating command; a voltage generating circuit which generates an operating voltage according to the operating command; and a flag generating circuit which receives a busy signal indicative of the non-volatile memory device performing the operation and a pump enable signal instructing pumping of the operating voltage, and outputs a flag signal based on the busy signal and the pump enable signal. The busy signal has a first level when the non-volatile memory device performs the operation, and the flag signal transitions from a second level to the first level in response to the operating voltage becoming equal to or higher than a first reference voltage while the busy signal is at the first level.

Embodiments of the inventive concepts further provide a storage device including a non-volatile memory device which receives first and second commands, and performs a first operation corresponding to the first command; a flag generating circuit which receives a busy signal indicative of performing the first operation from the non-volatile memory device, and outputs a flag signal based on the busy signal; and a voltage generating circuit which generates an operating voltage according to the first command. The busy signal has a first level when the non-volatile memory device performs the first operation, and the flag signal transitions from a second level to the first level in response to the second command while the busy signal is at the first level.

Embodiments of the inventive concepts still further provide a memory system including a storage device; and a processor which transmits a first command to the storage device. The storage device outputs to the processor a busy signal having a first level indicative that the storage device performs a first operation while performing the first operation corresponding to the first command, and outputs to the processor a flag signal indicating reliability of the first operation while outputting the busy signal having the first level to the processor.

BRIEF DESCRIPTION OF THE DRAWINGS

Embodiments of the inventive concepts will be more clearly understood from the following detailed description taken in conjunction with the accompanying figures, and wherein like reference numerals refer to like parts throughout the various figures unless otherwise specified.

DETAILED DESCRIPTION OF THE EMBODIMENTS

Hereinafter, embodiments of the inventive concept will be described referring to the accompanying drawings. As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
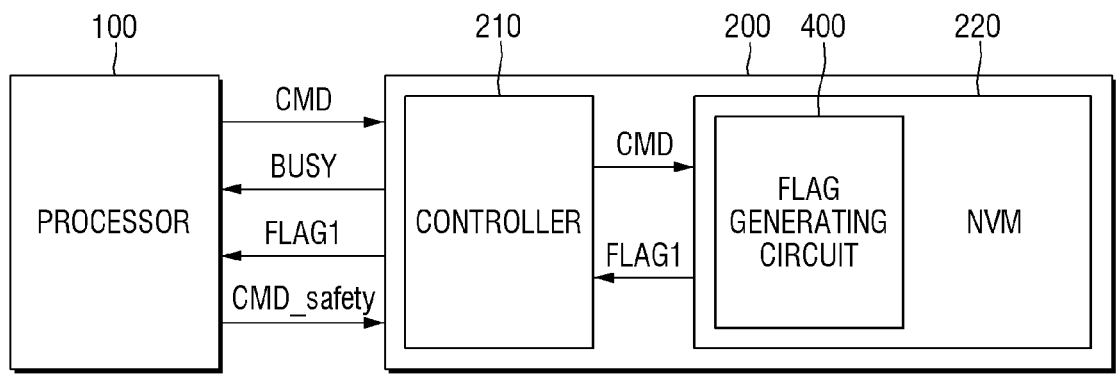
FIG. 1 illustrates a diagram of a memory system according to some embodiments of the inventive concepts.
Figure 2:
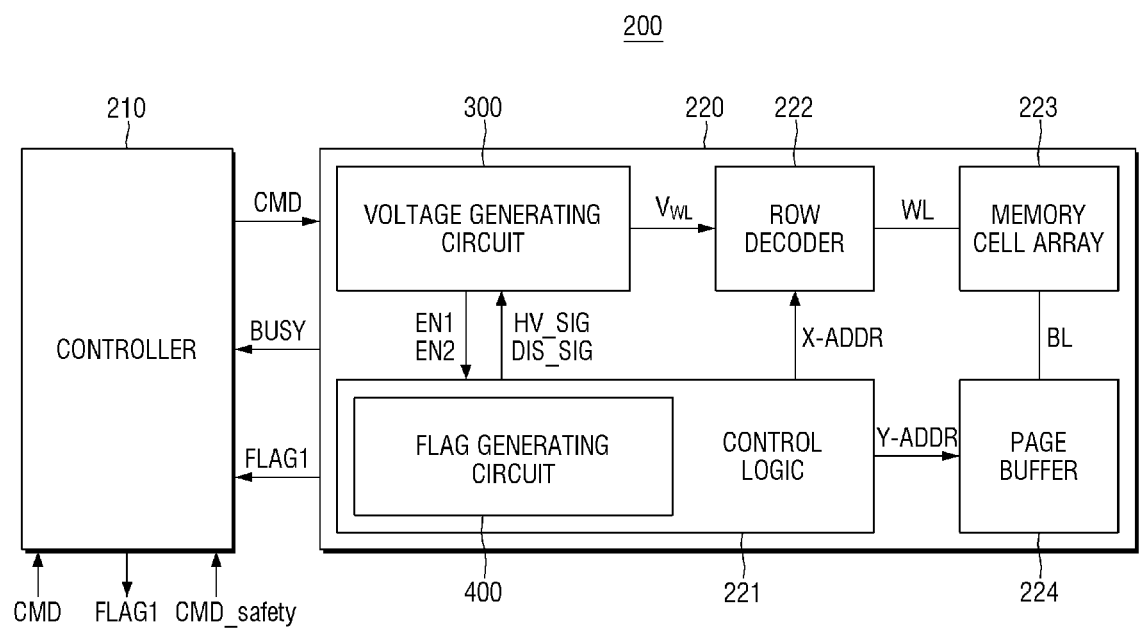
FIG. 2 illustrates a diagram of a storage device according to some embodiments of the inventive concepts.
Figure 3:
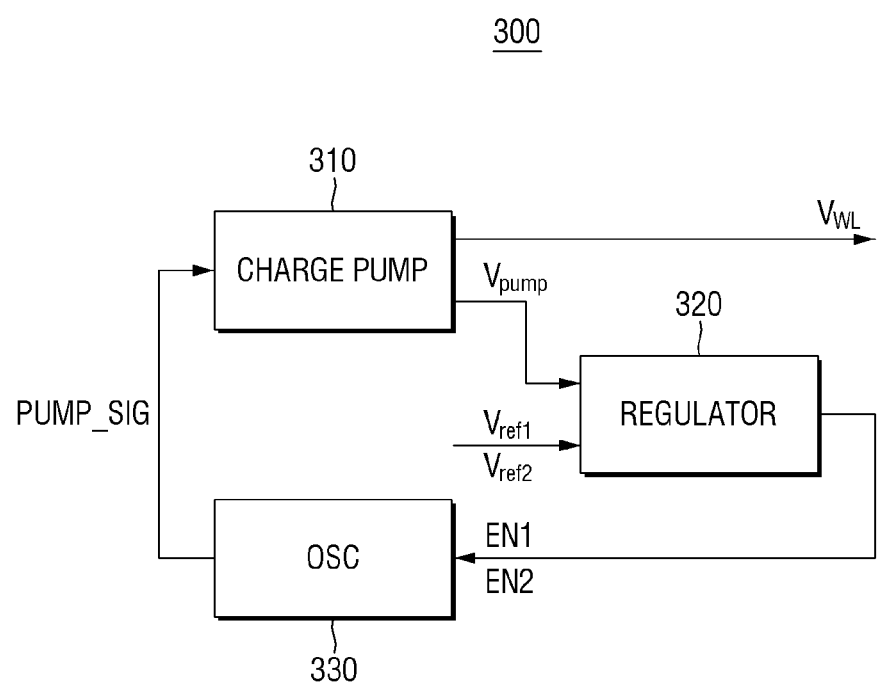
FIG. 3 illustrates a diagram of a voltage generating circuit of FIG. 2.
Figure 4:
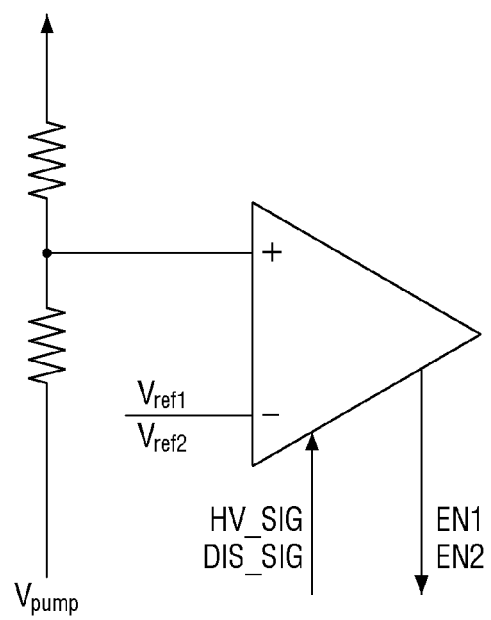
FIG. 4 illustrates a diagram of a regulator of FIG. 3.
Figure 5:
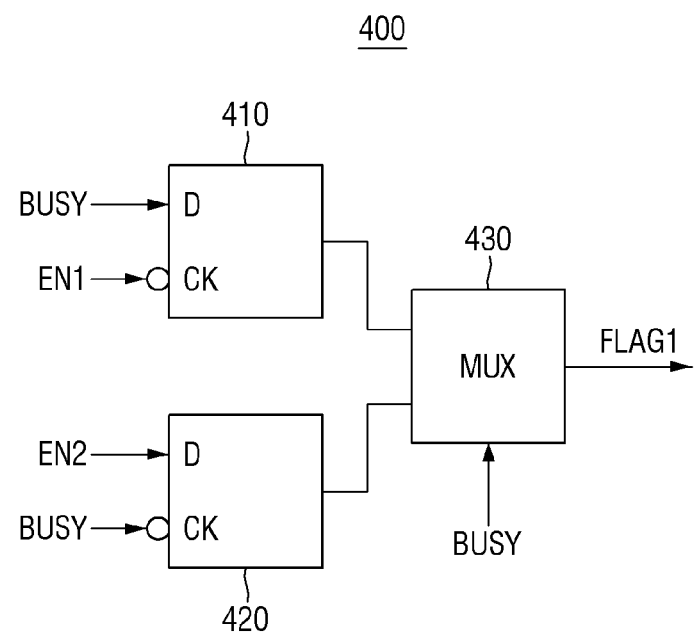
FIG. 5 illustrates a diagram of a flag generating circuit of FIG. 2.

FIG. 1 illustrates a diagram of a memory system according to some embodiments of the inventive concepts. FIG. 2 illustrates a diagram of a storage device according to some embodiments of the inventive concepts. FIG. 3 illustrates a diagram of a voltage generating circuit of FIG. 2. FIG. 4 illustrates a diagram of a regulator of FIG. 3. FIG. 5 illustrates a diagram of a flag generating circuit of FIG. 2.

Referring to FIG. 1, the memory system 1 may include a processor 100 and a storage device 200. The memory system 1 may for example be disposed as part of, but not limited to, a computer, a UMPC (Ultra Mobile PC), a workstation, a digital picture player, a digital video recorder, a storage forming a data center, a device that may send and receive information in a wireless environment, one of various electronic devices that form a home network, one of various electronic devices that form a computer network, one of various electronic devices that form a telematics network, one of various components that form a computing system, or the like.

The processor 100 may transmit a command CMD to the storage device 200 to program or read the data. The processor 100 may transmit the command CMD to the storage device 200 again in response to a flag signal FLAG1 received from the storage device 200, or may transmit a safety mode command CMD_safety for stopping the operation (e.g., programming or reading of the data) performed according (or responsive) to the command CMD.

The storage device 200 may include a controller 210, and a non-volatile memory device 220. The storage device 200 may be included in the memory system 1 in a state of being physically separated from the processor 100, or may be implemented inside the same package as the processor 100. The storage device 200 may be implemented as, but is not limited to, any one of for example a solid state drive (SSD), a Multi-Media Card™ (MMC), an eMMC® (embedded MMC), a miniSD™ card, and a microSD® card.

The controller 210 may be connected to the processor 100 and the non-volatile memory device 220. The controller 210 may control the non-volatile memory device 220 in response to a request from the processor 100. For example, the controller 210 may be configured to control read, program, and erase operations of the non-volatile memory device 220. The controller 210 may output a busy signal BUSY received from the control logic (e.g., circuit) 221 (e.g., see FIG. 2) to the processor 100.

Referring to FIG. 2, the non-volatile memory device 220 may include a control logic (e.g., circuit) 221, a row decoder 222, a memory cell array 223, a page buffer 224, a voltage generating circuit 300, and a flag generating circuit 400.

The control logic 221 may control the overall operations of the non-volatile memory device 220. The control logic 221 may output various control signals for writing the data to the memory cell array 223 or reading the data from the memory cell array 223 in response to the command CMD and/or address ADDR from the controller 210. For example, the control logic 221 may transmit a high voltage generation signal HV_SIG or a discharge signal DIS_SIG to the voltage generating circuit 300 on the basis of the command CMD, output a row address X-ADDR to the row decoder 222 on the basis of the address ADDR, and output a column address Y-ADDR to the page buffer 224.

When the control logic 221 receives the command CMD from the controller 210 and performs a program operation or an erase operation, the control logic 221 may output a busy signal BUSY of a first level (e.g., a logical high level, hereinafter H) indicating that the operation is being performed to the controller 210. That is, the busy signal BUSY which is output with the first level H means that the non-volatile memory device 220 continuously performs the program operation or the erase operation. Further, the control logic 221 may output a busy signal BUSY of a second level (e.g., a logical low level, hereafter L) indicating completion of operation to the controller 210, when the program operation or the erase operation is completed.

The row decoder 222 may select one of a plurality of word lines in response to the row address X-ADDR. The row decoder 222 may supply the selected word lines and the non-selected word lines with word line voltages according to each operating mode. For example, at the time of the program operation, the row decoder 222 may apply a program voltage to the selected word line and supply a pass voltage to the non-selected word line. Further, the row decoder 222 may supply a ground voltage to the selected word line and apply a read voltage to the non-selected word line at the time of the read operation.

The memory cell array 223 may be made up of a plurality of memory cell blocks, and each of the plurality of memory blocks may include a plurality of memory cells. Each memory cell may be a cell (single level cell, SLC) that stores 1-bit information, and may be a cell that stores 2-bits or more information such as an MLC (multi level cell), a TLC (triple level cell), and a QLC (quadruple level cell). The memory cell blocks may be stacked in a three-dimensional form without being limited to a two-dimensional form. Each block of the memory cell array 223 may include a plurality of word lines WL and a plurality of bit lines BL.

The page buffer 224 may be connected to each of the memory cells through a plurality of bit lines BL. The page buffer 224 may select at least one bit line among the bit lines BL in response to the column address Y-ADDR. The page buffer 224 may operate as a write driver or a detection amplifier, depending on the operating mode. For example, at the time of the program operation, the page buffer 224 may apply a bit line voltage corresponding to the data to be programmed onto the selected bit line. Further, at the time of the read operation, the page buffer 224 may detect the current or voltage of the selected bit line and detect the data stored in the memory cell.

The voltage generating circuit 300 may generate the voltages required for operation according to the command CMD from the controller 210. The voltage generating circuit 300 may generate various types of voltages for performing program, erase, and read operations, on the basis of the high voltage generation signal HV_SIG or the discharge signal DIS_SIG received from the control logic 221. For example, when performing the program operation or the erase operation, the voltage generating circuit 300 may generate a program voltage, an erase voltage, or the like which is a high voltage, as a word line voltage $V_{WL}$. Further, when a discharge signal DIS_SIG is received from the control logic 221, the voltage generating circuit 300 may discharge the high voltage provided as the word line voltage to generate a relatively low voltage. The voltage generating circuit 300 will be described in detail below referring to FIG. 3.

Referring to FIG. 3, the voltage generating circuit 300 may include a charge pump 310, a regulator 320, and an oscillator 330.

The charge pump 310 receives a pumping signal PUMP_SIG from the oscillator 330, pumps an input voltage (not shown), and outputs an operating voltage Vpump. The charge pump 310 for example uses a capacitor as an energy storage element, and may include a number of switches driven by a clock signal (not shown).

The regulator 320 receives the operating voltage Vpump from the charge pump 310, compares it with reference voltages Vref1 and Vref2 to adjust the level of the pump enable signal EN1 or the discharge enable signal EN2, and outputs the pump enable signal EN1 or the discharge enable signal EN2 to the oscillator 330.

Referring to FIG. 4, the regulator 320 receives the high voltage generation signal HV_SIG, compares the operating voltage Vpump output from the charge pump 310 with the first reference voltage Vref1, and outputs the pump enable signal EN1. Further, the regulator 320 receives the discharge signal DIS_SIG, compares the operating voltage Vpump output from the charge pump 310 with the second reference voltage Vref2, and outputs the discharge enable signal EN2.

Referring to FIG. 3 again, the oscillator 330 transmits the pumping signal PUMP_SIG to the charge pump 310 in response to the pump enable signal EN1 or the discharge enable signal EN2 received from the regulator 320. The pump enable signal EN1 instructs the high voltage generation of the voltage generating circuit 300, and the discharge enable signal EN2 instructs the high voltage discharge of the voltage generating circuit 300.

Referring to FIG. 2 again, the flag generating circuit 400 may check whether the level of the voltage generated by the voltage generating circuit 300 is relevant to a level of voltage corresponding to the high voltage generation signal HV_SIG or the discharge signal DIS_SIG transmitted from the control logic 221 to output a flag signal FLAG1. Although FIG. 2 shows that the flag generating circuit 400 is included in the control logic 221, embodiments are not limited thereto. In some other embodiments, the flag generating circuit 400 may also be placed outside the control logic 221. The flag generating circuit 400 will be described in detail below referring to FIG. 5.

Referring to FIG. 5, the flag generating circuit 400 may include a first flip-flop 410, a second flip-flop 420, and a multiplexer 430.

The first flip-flop 410 may output a busy signal BUSY on the basis of the pump enable signal EN1. The first flip-flop 410 is triggered at an edge in which the pump enable signal EN1 changes from a first level H to a second level L, and may output the busy signal BUSY. In such a case, because the first flip-flop 410 is triggered at the time point when the pump enable signal EN1 changes from the first level H to the second level L, the first flip-flop 410 is a falling edge flip-flop, but embodiments are not limited thereto.

For example, when the first flip-flop 410 outputs the busy signal BUSY on the basis of a complementary signal EN1*b* of the pump enable signal EN1, the first flip-flop 410 may be triggered at the time point when the complementary signal EN1*b* of the pump enable signal EN1 changes from the second level L to the first level H to output the busy signal BUSY. In such cases, the first flip-flop 410 may be a rising edge flip-flop.

The second flip-flop 420 may output the discharge enable signal EN2 on the basis of the busy signal BUSY. The second flip-flop 420 may be triggered at the edge in which the busy signal BUSY changes from the first level H to the second level L to output the discharge enable signal EN2. In such a case, because the second flip-flop 420 is triggered at the time point when the busy signal BUSY changes from the first level H to the second level L, the second flip-flop 420 is a falling edge flip-flop, but the embodiments are not limited thereto.

For example, when the second flip-flop 420 outputs the discharge enable signal EN2 on the basis of the complementary signal BUSYb of the busy signal BUSY, the second flip-flop 420 may be triggered at the time point when the complementary signal BUSYb of the busy signal BUSY changes from the second level L to the first level H to output the discharge enable signal EN2. In such a case, the second flip-flop 420 may be a rising edge flip-flop.

Although FIG. 5 shows the first flip-flop 410 and the second flip-flop 420 as D flip-flops, embodiments are not limited thereto. For example, the first flip-flop 410 and the second flip-flop 420 may be SR flip-flops, JK flip-flops or T flip-flops.

The multiplexer 430 may select and output one of the output signal of the first flip-flop 410 and the output signal of the second flip-flop 420 in accordance with the level of the busy signal BUSY. Although FIG. 5 shows that the input signal of the multiplexer 430 is a busy signal BUSY, the embodiments are not limited thereto. For example, the multiplexer 430 may select and output one of an output signal of the first flip-flop 410 and an output signal of the second flip-flop 420, using the complementary signal BUSYb of the busy signal BUSY as an input signal.

Figure 6:
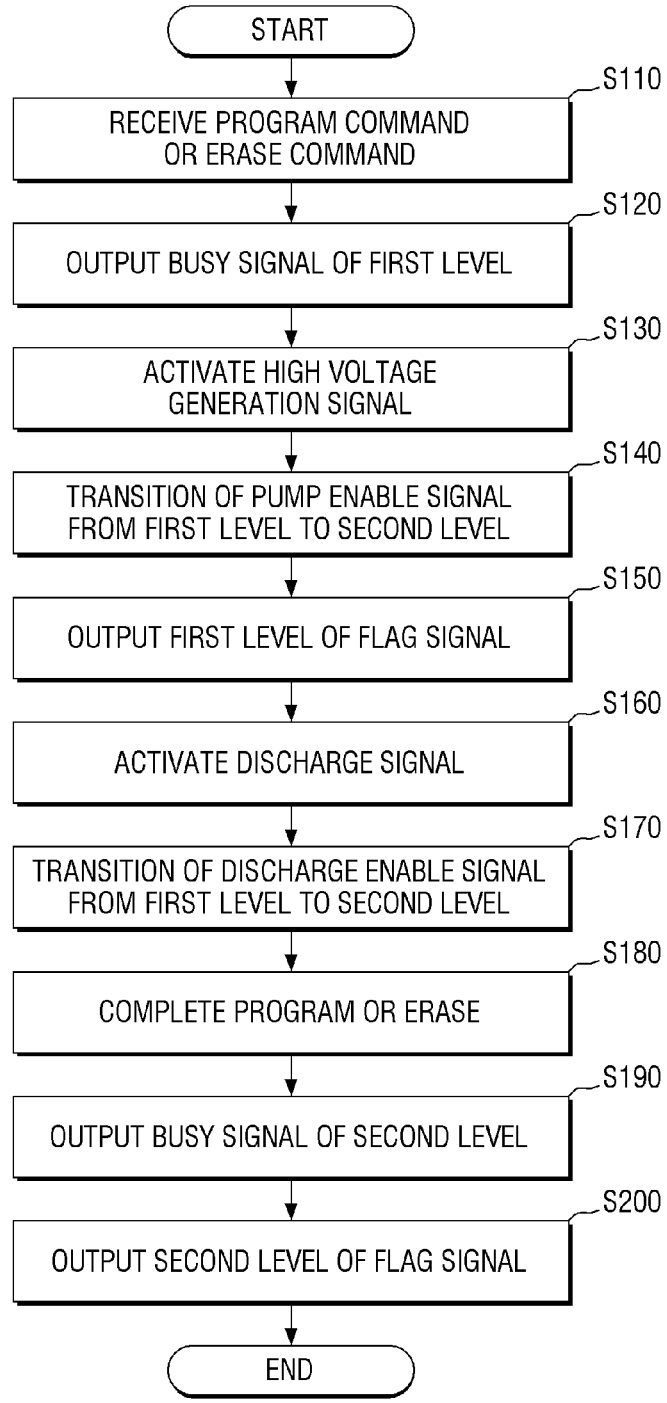
FIG. 6 illustrates a flowchart explanatory of the operation of the storage device according to some embodiments of the inventive concepts.
Figure 7:
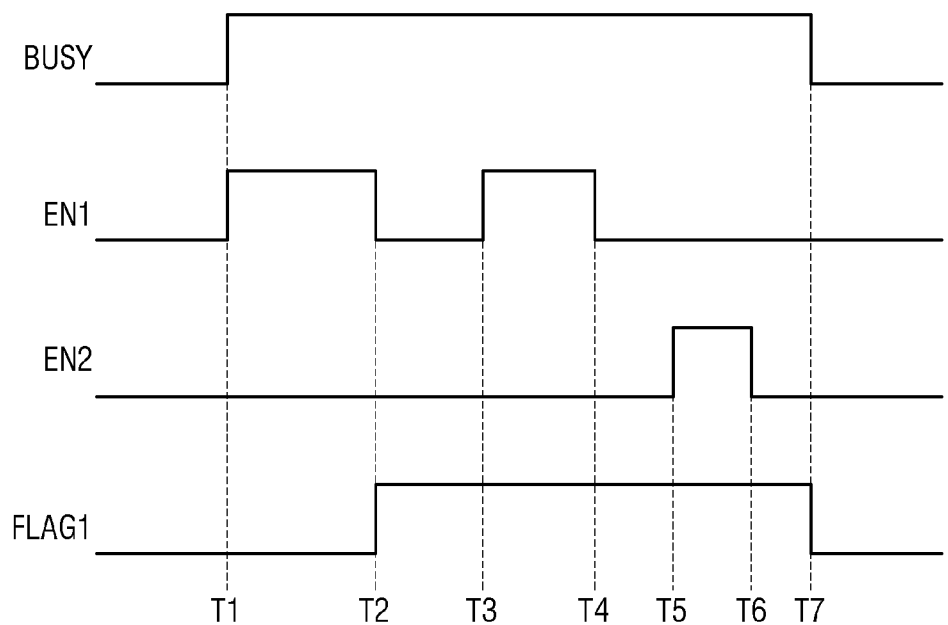
FIG. 7 illustrates a timing diagram explanatory of the operation of the storage device according to some embodiments of the inventive concepts.
Figure 8:
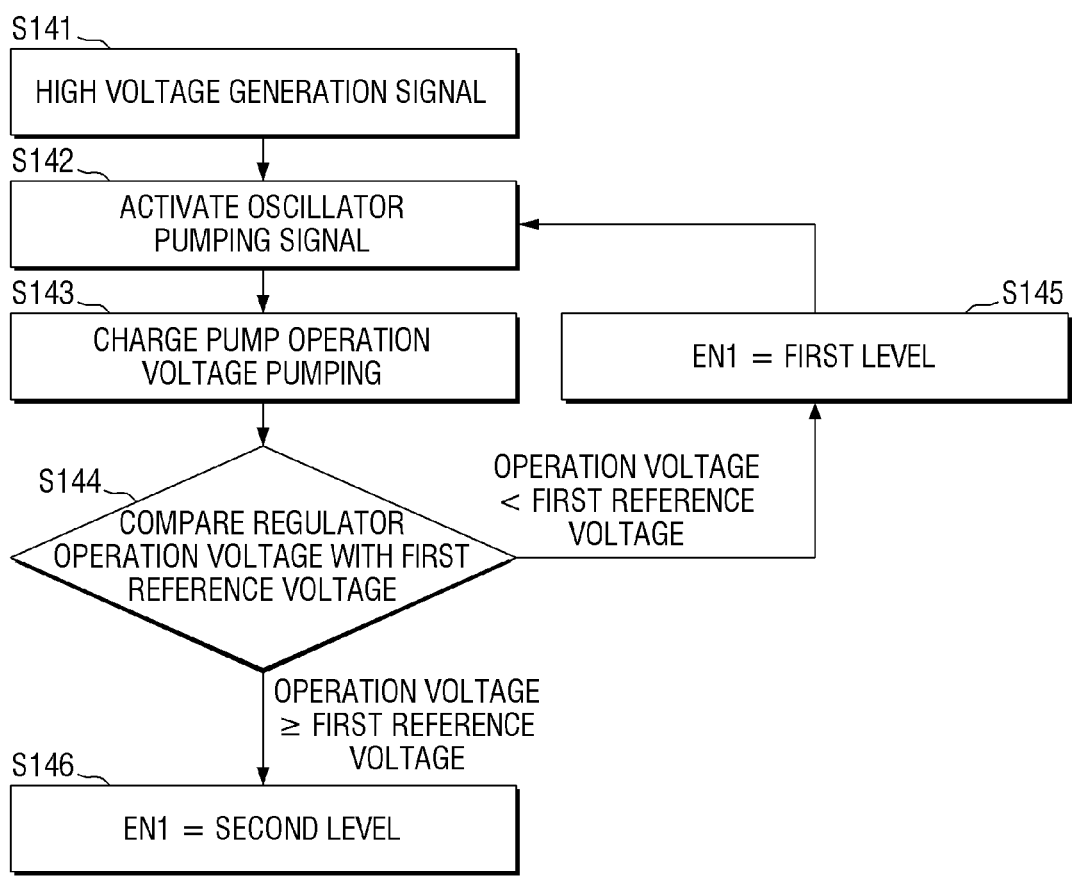
FIG. 8 illustrates a flowchart explanatory of the operation of the voltage generating circuit of the storage device according to some embodiments of the inventive concepts.
Figure 9:
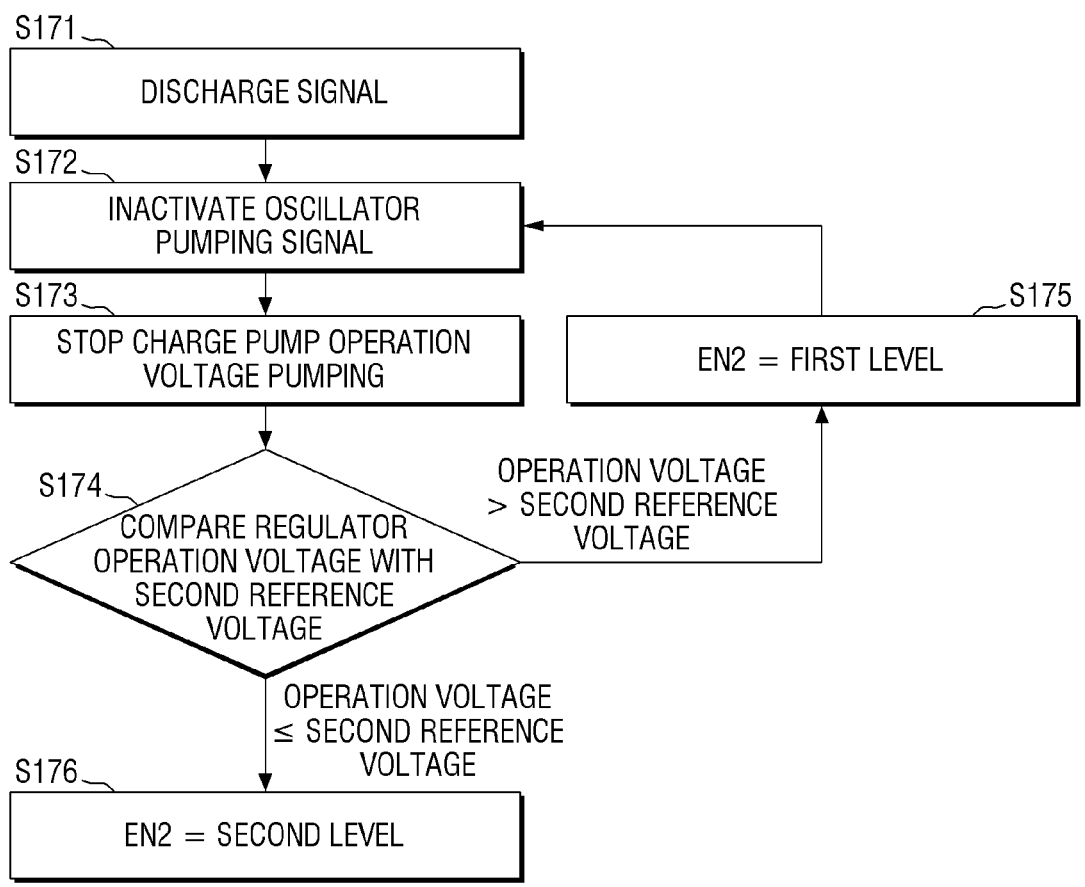
FIG. 9 illustrates a flowchart explanatory of the operation of the voltage generating circuit of the storage device according to some embodiments of the inventive concepts.
Figure 10:
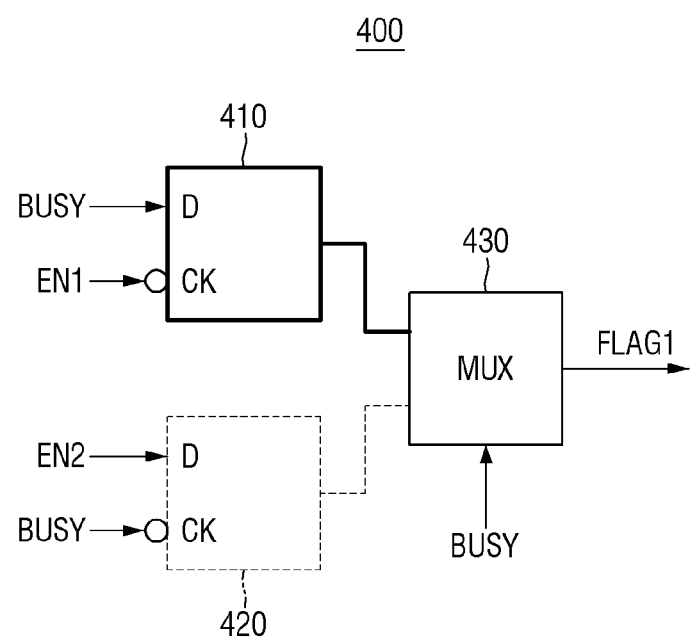
FIG. 10 illustrates a diagram explanatory of the operation of the flag generating circuit of the storage device according to some embodiments of the inventive concepts.
Figure 11:
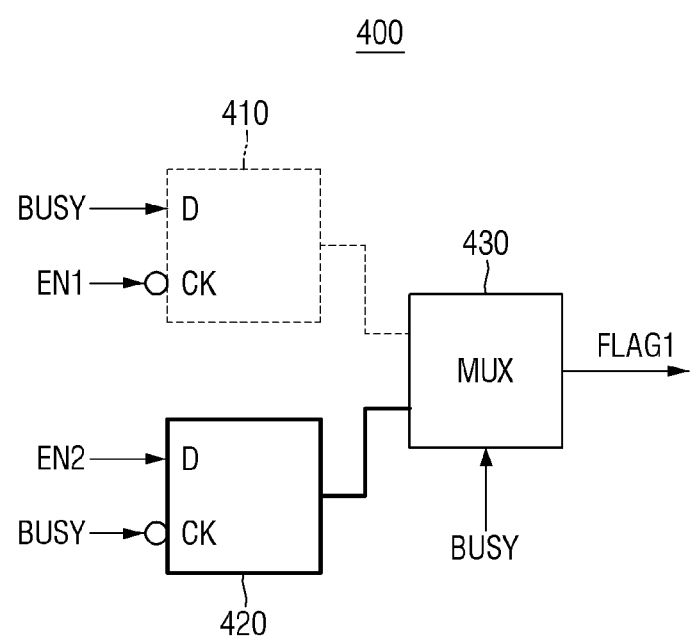
FIG. 11 illustrates a diagram explanatory of the operation of the flag generating circuit of the storage device according to some embodiments of the inventive concepts.

FIG. 6 illustrates a flowchart explanatory of the operation of the storage device according to some embodiments of the inventive concepts. FIG. 7 illustrates a timing diagram explanatory of the operation of the storage device according to some embodiments of the inventive concepts. FIGS. 8 and 9 illustrates flowcharts explanatory of the operation of the voltage generating circuit of the storage device according to some embodiments of the inventive concepts. FIGS. 10 and 11 are diagrams explanatory of the operation of the flag generating circuit of the storage device according to some embodiments of the inventive concepts.

Referring to FIGS. 2 and 6, at step S110, the storage device 200 receives a program or erase command CMD from the processor 100. At step S120, the storage device 200 outputs the busy signal BUSY of the first level H when the program or erase operation is started in response to the received program or erase command CMD.

For example, referring to FIG. 7, at a first time T1, the storage device 200 starts the program or erase operation in response to the program or erase command CMD from the processor 100, and may output the busy signal BUSY with the first level H.

Referring to FIGS. 2 and 6 again, at step S130, when the storage device 200 starts the program or erase operation, the control logic 221 activates the high voltage generation signal HV_SIG and transmits it to the voltage generating circuit 300. At step S140, the voltage generating circuit 300 outputs the pump enable signal EN1 as having the first level H in response to the high voltage generation signal HV_SIG received from the control logic 221, and when the high voltage is generated, the pump enable signal EN1 is output as having the second level L. The operation of the voltage generating circuit 300 of step S140 will be described in detail below referring to FIG. 8.

Referring to FIG. 8, at step S141, the voltage generating circuit 300 receives the high voltage generation signal HV_SIG from the control logic 221. At step S142, the oscillator 330 activates the pumping signal PUMP_SIG for instructing the charge pump 310 to pump the input voltage, and transmits the pumping signal PUMP_SIG to the charge pump 310. At step S143, the charge pump 310 pumps the input voltage in response to the activated pumping signal PUMP_SIG to output the operating voltage Vpump. At step S144, the regulator 320 compares the operating voltage Vpump received from the charge pump 310 with the first reference voltage Vref1. At step S145, the regulator 320 outputs the pump enable signal EN1 with the first level H, when the operating voltage Vpump is lower than the first reference voltage Vref1. At step S146, the regulator 320 outputs the pump enable signal EN1 with the second level L, when the operating voltage Vpump is higher than or equal to the first reference voltage Vref1.

For example, referring to FIGS. 7 and 8, at the first time T1, the voltage generating circuit 300 outputs the pump enable signal EN1 with the first level H, in response to the high voltage generation signal HV_SIG received from the control logic 221. From the first time T1 before the second time T2, the regulator 320 maintains the pump enable signal EN1 with the first level H, when the operating voltage Vpump is lower than the first reference voltage Vref1. At the second time T2, the regulator 320 outputs the pump enable signal EN1 with the second level L, when the operating voltage Vpump is higher than or equal to the first reference voltage Vref1. When the operating voltage Vpump becomes lower than the first reference voltage Vref1 again, at the third time T3, the regulator 320 outputs the pump enable signal EN1 with the first level H again. At the fourth time T4, when the operating voltage Vpump becomes higher than or equal to the first reference voltage Vref1 again, the regulator 320 outputs the pump enable signal EN1 with the second level L again. That is, the operating voltage Vpump is higher than or equal to the first reference voltage Vref1 during the time between the second time T2 and the third time T3. Also, the operating voltage Vpump is lower than the first reference voltage Vref1 during the time between the first time T1 and the second time T2, and the time between the third time T3 and the fourth time T4.

Referring to FIGS. 2 and 6 again, when the pump enable signal EN1 transitions from the first level H to the second level L, the flag generating circuit 400 outputs the flag signal FLAG1 having the first level H in response to the transition at step S150. The operation of the flag generating circuit 400 of step S150 will be described in detail below referring to FIG. 10.

Referring to FIG. 10, the multiplexer 430 selects the output signal of the first flip-flop 410 and outputs it as the flag signal FLAG1, when the busy signal BUSY is the first level H. The first flip-flop 410 outputs the busy signal BUSY in response to the transition of the pump enable signal EN1 from the first level H to the second level L. Although FIG. 10 shows that the multiplexer 430 selects the output signal of the first flip-flop 410 and outputs it as the flag signal FLAG1 when the busy signal BUSY is the first level H, embodiments are not limited thereto. For example, when the complementary signal BUSYb of the busy signal BUSY is the second level L, the multiplexer 430 may select the output signal of the first flip-flop 410 and output it as the flag signal FLAG1, using the complementary signal BUSYb of the busy signal BUSY as an input signal.

For example, referring to FIGS. 7 and 10, when the pump enable signal EN1 transitions from the first level H to the second level L at the second time T2, the first flip-flop 410 outputs the busy signal BUSY which is the first level H at the second time T2, in response to the transition. Further, since the busy signal BUSY is the first level H at the second time T2, the multiplexer 430 selects the busy signal BUSY of the first level H which is the output signal of the first flip-flop 410, and outputs the busy signal BUSY as the flag signal FLAG1. Therefore, the flag signal FLAG1 transitions from the second level L to the first level H at the second time T2. Similarly, when the pump enable signal EN1 transitions from the first level H to the second level L at the fourth time T4, the flag signal FLAG1 is continuously output with the first level H.

Referring FIGS. 2 and 6 again, at step S160, the control logic 221 activates the discharge signal DIS_SIG and transmits it to the voltage generating circuit 300. For example, the control logic 221 may activate the discharge signal DIS_SIG when it determines that the data storage is completed in the memory cell. At step S170, the voltage generating circuit 300 outputs the discharge enable signal EN2 as having the first level H in response to the discharge signal DIS_SIG received from the control logic 221, and outputs the discharge enable signal EN2 as having the second level L when the operating voltage Vpump is discharged. The operation of the voltage generating circuit 300 of step S170 will be described in detail below referring to FIG. 9.

Referring to FIG. 9, at step S171, the voltage generating circuit 300 receives the discharge signal DIS_SIG from the control logic 221. At step S172, the oscillator 330 inactivates (i.e., deactivates) the pumping signal PUMP_SIG that instructs the charge pump 310 to pump the input voltage, and transmits it to the charge pump 310. At step S173, the charge pump 310 outputs the operating voltage Vpump in response to the inactivated pumping signal PUMP_SIG. At step S174, the regulator 320 compares the operating voltage Vpump received from the charge pump 310 with the second reference voltage Vref2. At step S175, when the operating voltage Vpump is higher than the second reference voltage Vref2, the regulator 320 outputs the discharge enable signal EN2 with the first level H. At step S176, when the operating voltage Vpump is lower than or equal to the second reference voltage Vref2, the regulator 320 outputs the discharge enable signal EN2 with the second level L.

For example, referring to FIGS. 7 and 9, at the fifth time T5, the voltage generating circuit 300 output the discharge enable signal EN2 with the first level H in response to the discharge signal DIS_SIG received from the control logic 221. From the fifth time T5 before the sixth time T6, when the operating voltage Vpump is higher than the second reference voltage Vref2, the regulator 320 maintains the discharge enable signal EN2 with the first level H. At the sixth time T6, when the operating voltage Vpump is lower than or equal to the second reference voltage Vref2, the regulator 320 outputs the discharge enable signal EN2 with the second level L.

Referring to FIGS. 2 and 6 again, when the storage device 200 completes the program or erase operation corresponding to the command CMD received from the processor 100 at step S180, the storage device 200 outputs the busy signal BUSY of the second level L at step S190.

For example, referring to FIG. 7, the storage device 200 may complete the program or erase operation and output the busy signal BUSY with the second level L at the seventh time T7.

Referring to FIGS. 2 and 6 again, when the busy signal BUSY transitions from the first level H to the second level L, in response to the transition, the flag generating circuit 400 outputs the flag signal FLAG1 with the second level L at step S200. The operation of the flag generating circuit 400 of step S200 will be described in detail below referring to FIG. 11.

Referring to FIG. 11, when the busy signal BUSY is the second level L, the multiplexer 430 selects the output signal of the second flip-flop 420 and outputs it as the flag signal FLAG1. The second flip-flop 420 outputs the discharge enable signal EN2 in response to the transition of the busy signal BUSY from the first level H to the second level L. Although FIG. 11 shows that the multiplexer 430 selects the output signal of the second flip-flop 420 and outputs it as the flag signal FLAG1 when the busy signal BUSY is the second level L, embodiments are not limited thereto. For example, the multiplexer 430 may select the output signal of the second flip-flop 420 and output it as the flag signal FLAG1, using the complementary signal BUSYb of the busy signal BUSY as an input signal, when the complementary signal BUSYb of the busy signal BUSY is the first level H.

For example, referring to FIGS. 7 and 11, when the busy signal BUSY transitions from the first level H to the second level L at the seventh time T7, the second flip-flop 420 outputs the discharge enable signal EN2, which is the second level L at the seventh time T7, in response to the transition. Further, since the busy signal BUSY is the second level L at the seventh time T7, the multiplexer 430 selects the discharge enable signal EN2 of the second level L which is the output signal of the second flip-flop 420 and outputs it as the flag signal FLAG1. Therefore, the flag signal FLAG1 transitions from the first level H to the second level L at the seventh time T7.

Figure 12:
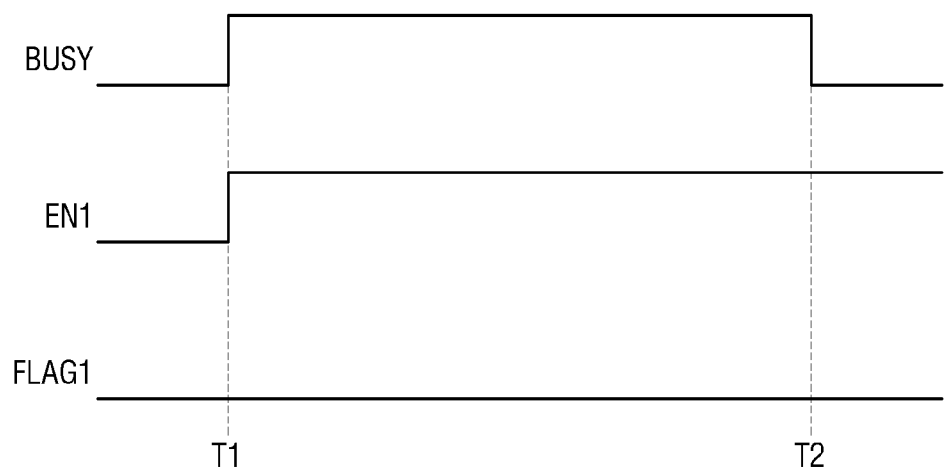
FIG. 12 illustrates a timing diagram explanatory of the operation of the storage device according to some other embodiments of the inventive concepts.

FIG. 12 illustrates a timing diagram explanatory of the operation of the storage device according to some other embodiments of the inventive concepts. For convenience of explanation, points different from those described referring to FIG. 7 will be mainly described.

Referring to FIGS. 8 and 12, at the first time T1, the voltage generating circuit 300 outputs the pump enable signal EN1 as having the first level H, in response to the high voltage generation signal HV_SIG received from the control logic 221. The regulator 320 maintains the pump enable signal EN1 as having the first level H, when the operating voltage Vpump is lower than the first reference voltage Vref1.

Referring to FIGS. 10 and 12, while the busy signal BUSY is output as having the first level H, the pump enable signal EN1 does not transition from the first level H to the second level L. Therefore, the first flip-flop 410 does not output the busy signal BUSY of the first level H. Accordingly, the flag signal FLAG1 is not output as having the first level H and is maintained as having the second level L.

This means that the high voltage required for the program operation or the erase operation (for example, a voltage equal to or higher than the first reference voltage Vref) has not been generated. In some embodiments, in this case, the processor 100 that receives the flag signal FLAG1 maintained with the second level L may transmit the command CMD to the storage device 200 again to perform the program operation or the erase operation again. Also, in some embodiments, the processor 100 may transmit the safety mode command CMD_safety for stopping the program operation or erase operation to the storage device 200. In this way, the processor 100 may check whether the storage device 200 performs the program operation or erase operation according to the command CMD without any defect through (or by monitoring) the flag signal FLAG1. Also, since the processor 100 transmits the program or erase command CMD or the safety mode command CMD_safety in accordance with the flag signal FLAG1, the storage device 200 may perform the program operation or the erase operation without any defect.

Figure 13:
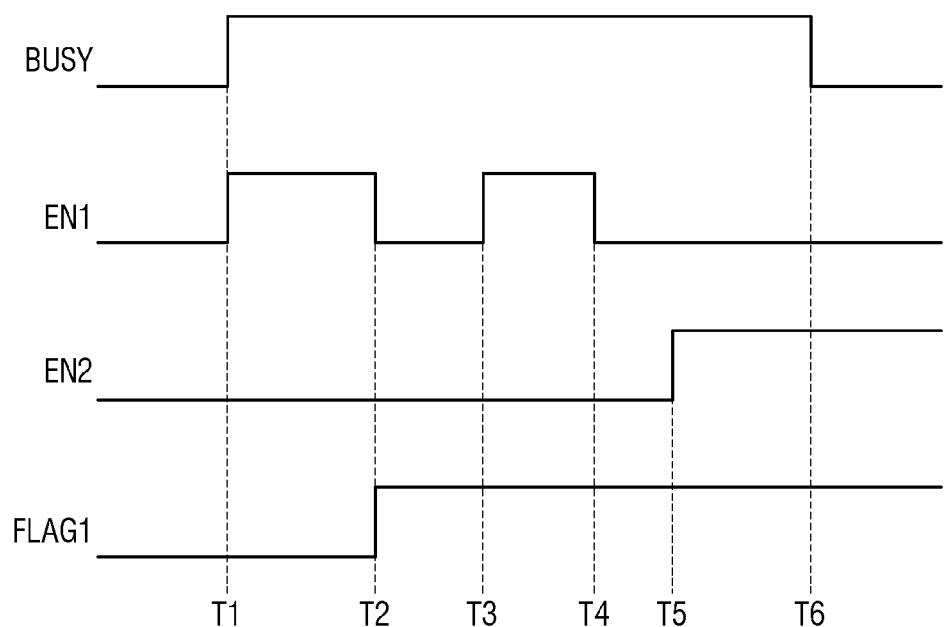
FIG. 13 illustrates a timing diagram explanatory of the operation of the storage device according to some other embodiments of the inventive concepts.

FIG. 13 illustrates a timing diagram explanatory of the operation of the storage device according to some other embodiments of the inventive concepts. For convenience of explanation, points different from those described referring to FIG. 7 will be mainly described.

Referring to FIGS. 9 and 13, at the fifth time T5, the voltage generating circuit 300 outputs the discharge enable signal EN2 with the first level H, in response to the discharge signal DIS_SIG received from the control logic 221. The regulator 320 maintains the discharge enable signal EN2 as having the first level H, when the operating voltage Vpump is higher than the second reference voltage Vref2.

Referring to FIGS. 11 and 13, even if the busy signal BUSY transitions from the first level H to the second level L at the sixth time T6, since the discharge enable signal EN2 is maintained with the first level H, the second flip-flop 420 outputs the discharge enable signal EN2 of the first level H. Accordingly, at the sixth time T6, the flag signal FLAG1 does not transition from the first level H to the second level L, but is maintained as having the first level H.

This means that the high voltage used for the program operation or the erase operation is not discharged. In some embodiments, in this case, the control logic 221 may transmit the discharge signal DIS_SIG to the voltage generating circuit 300 again to discharge the high voltage used for the program operation or the erase operation again. Also, in some embodiments, the processor 100 that receives the flag signal FLAG1 in this case may transmit the safety mode command CMD_safety which stops the program operation or the erase operation to the storage device 200. In this way, the processor 100 may check whether the storage device 200 performs the program operation or the erase operation according to the command CMD without any defect through (or by monitoring) the flag signal FLAG1. Also, since the processor 100 transmits the program or erase command CMD or the safety mode command CMD_safety in accordance with the flag signal FLAG1, the storage device 200 may perform the program operation or the erase operation without any defect.

Figure 14:
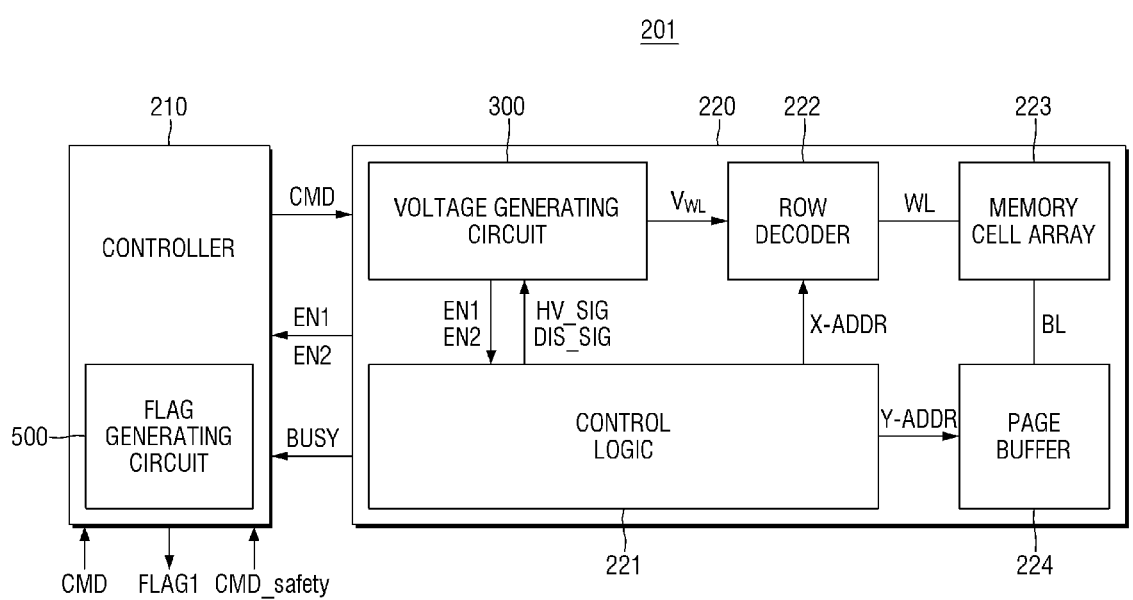
FIG. 14 illustrates a diagram of a storage device according to some embodiments of the inventive concepts.

FIG. 14 illustrates a diagram of a storage device according to some embodiments of the inventive concepts. For convenience of explanation, points different from those described referring to FIG. 2 will be mainly described.

Referring to FIG. 14, the flag generating circuit 500 is included in the controller 210. The control logic 221 may transmit the pump enable signal EN1 and the discharge enable signal EN2 received from the voltage generating circuit 300 to the flag generating circuit 500. The flag generating circuit 500 may output the flag signal FLAG1 on the basis of the pump enable signal EN1, the discharge enable signal EN2, and the busy signal BUSY received from the control logic 221.

Figure 15:
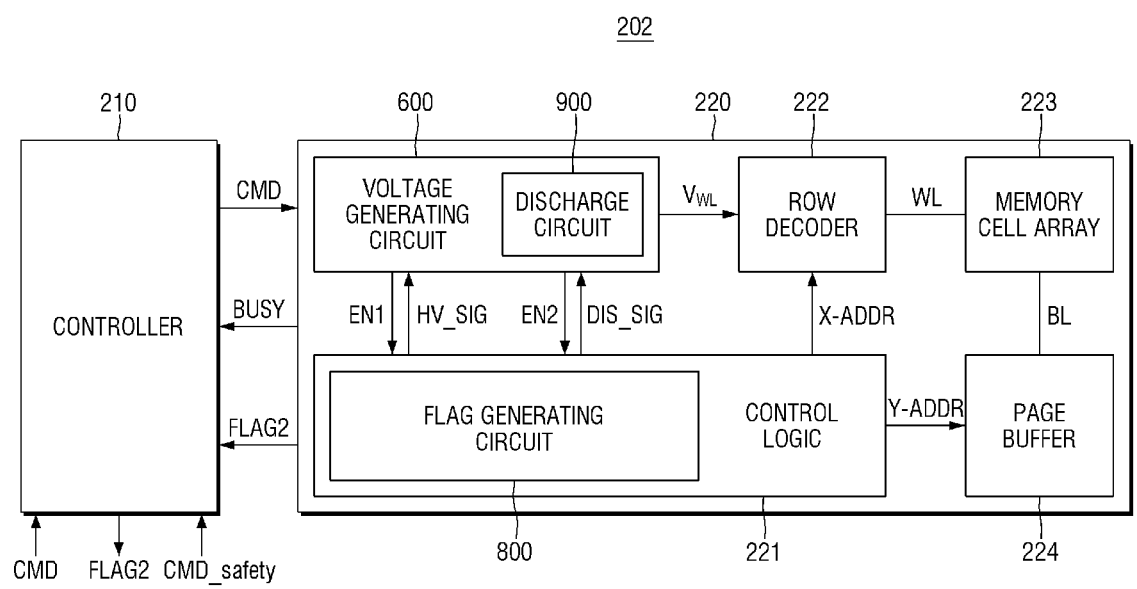
FIG. 15 illustrates a diagram of a storage device according to some embodiments of the inventive concepts.
Figure 16:
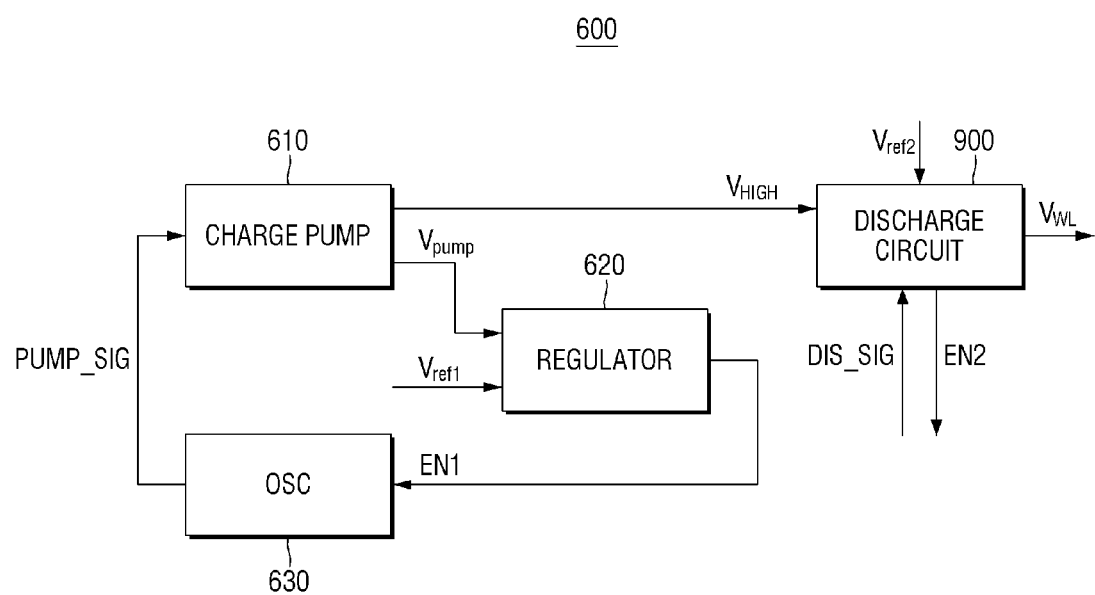
FIG. 16 illustrates a diagram of the voltage generating circuit of FIG. 15.
Figure 17:
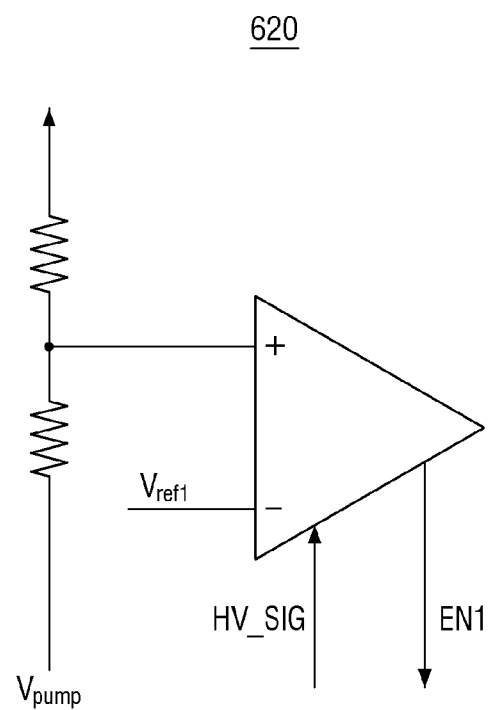
FIG. 17 illustrates a diagram of the regulator of FIG. 16.
Figure 18:
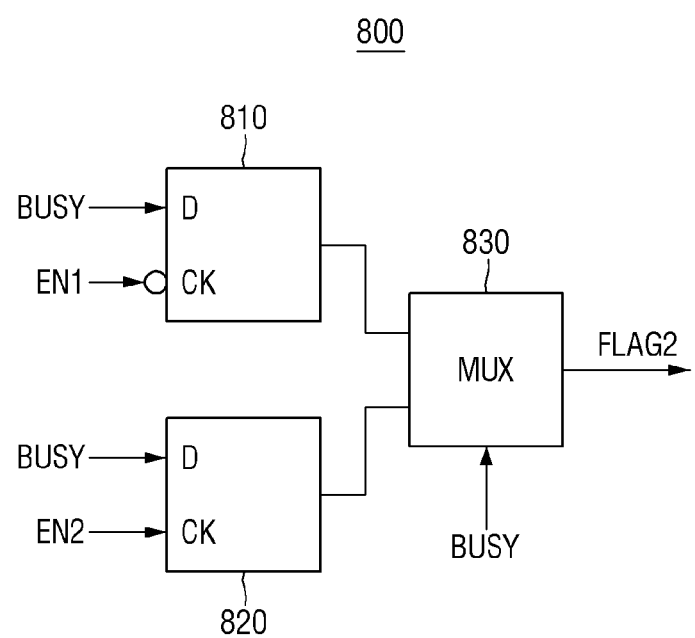
FIG. 18 illustrates a diagram of the flag generating circuit of FIG. 15.

FIG. 15 illustrates a diagram of a storage device 202 according to some embodiments of the inventive concepts. FIG. 16 illustrates a diagram of the voltage generating circuit of FIG. 15. FIG. 17 illustrates a diagram of the regulator of FIG. 16. FIG. 18 illustrates a diagram of the flag generating circuit of FIG. 15. For convenience of explanation, points different from those described referring to FIGS. 2 to 5 will be mainly described.

Referring to FIG. 15, the non-volatile memory device 220 may further include a discharge circuit 900. The discharge circuit 900 may discharge the high voltage generated by the voltage generating circuit 600 in response to the discharge signal DIS_SIG received from the control logic 221.

Referring to FIG. 16, the voltage generating circuit 600 may include a charge pump 610, a regulator 620, an oscillator 630, and a discharge circuit 900.

The charge pump 610 receives a pumping signal PUMP_SIG from the oscillator 630, pumps an input voltage (not shown), and outputs an operating voltage Vpump and a high voltage $V_{HIGH}$.

The regulator 620 receives the operating voltage Vpump from the charge pump 610, compares it with the first reference voltage Vref1, adjusts the level of the pump enable signal EN1, and outputs it to the oscillator 630.

Referring to FIG. 17, the regulator 620 receives the high voltage generation signal HV_SIG, compares the operating voltage Vpump output from the charge pump 610 with the first reference voltage Vref1, and outputs the pump enable signal EN1.

Referring to FIG. 16 again, the oscillator 630 transmits the pumping signal PUMP_SIG to the charge pump 610 in response to the pump enable signal EN1 received from the regulator 620. The pump enable signal EN1 instructs the high voltage generation of the voltage generating circuit 600.

The discharge circuit 900 receives the discharge signal DIS_SIG, compares the high voltage $V_{HIGH}$ output from the charge pump 610 with the second reference voltage Vref, adjusts the level of the discharge enable signal EN2, and outputs it as $V_{WL}$.

Referring to FIG. 15 again, the flag generating circuit 800 checks whether the level of the voltage generated by the voltage generating circuit 600 is relevant to the level of voltage corresponding to the high voltage generation signal HV_SIG or the discharge signal DIS_SIG transmitted from the control logic 221, and may output the flag signal FLAG2 to the outside. Although FIG. 15 shows that the flag generating circuit 800 is included in the control logic 221, embodiments are not limited thereto. In some other embodiments, the flag generating circuit 800 may also be placed outside the control logic 221. The flag generating circuit 800 will be described in detail below referring to FIG. 18.

Referring to FIG. 18, the flag generating circuit 800 may include a first flip-flop 810, a second flip-flop 820, and a multiplexer 830.

The first flip-flop 810 may output the busy signal BUSY on the basis of the pump enable signal EN1. The first flip-flop 810 is triggered at an edge in which the pump enable signal EN1 changes from the first level H to the second level L, and may output the busy signal BUSY. In such a case, since the first flip-flop 810 is triggered at the time point when the pump enable signal EN1 changes from the first level H to the second level L, the first flip-flop 810 is a falling edge flip-flop, but embodiments are not limited thereto.

For example, when the first flip-flop 810 outputs the busy signal BUSY on the basis of the complementary signal EN1b of the pump enable signal EN1, the first flip-flop 810 is triggered at the time point when the complementary signal EN1b of the pump enable signal EN1 changes from the second level L to the first level H, and may output the busy signal BUSY. In such cases, the first flip-flop 810 may be a rising edge flip-flop.

The second flip-flop 820 may output the busy signal BUSY on the basis of the discharge enable signal EN2. The second flip-flop 820 may be triggered at the edge in which the discharge enable signal EN2 changes from the second level L to the first level H, and may output the busy signal BUSY. In such a case, since the second flip-flop 820 is triggered at the time point when the discharge enable signal EN2 changes from the second level L to the first level H, the second flip-flop 820 is a rising edge flip-flop, but the embodiments are not limited thereto.

For example, when the second flip-flop 820 outputs the busy signal BUSY on the basis of the complementary signal EN2b of the discharge enable signal EN2, the second flip-flop 820 is triggered at the time point when the complementary signal EN2b of the discharge enable signal EN2 changes from the first level H to the second level L, and may output the busy signal BUSY. In such a case, the second flip-flop 820 may be a falling edge flip-flop.

Although FIG. 18 shows the first flip-flop 810 and the second flip-flop 820 as D flip-flops, embodiments are not limited thereto. For example, the first flip-flop 810 and the second flip-flop 820 may be SR flip-flops, JK flip-flops or T flip-flops.

The multiplexer 830 may select and output one of the output signal of the first flip-flop 810 and the output signal of the second flip-flop 820 depending on the level of the busy signal BUSY. Although FIG. 18 shows that the input signal of the multiplexer 830 is the busy signal BUSY, embodiments are not limited thereto. For example, the multiplexer 830 may select and output one signal of the output signal of the first flip-flop 810 and the output signal of the second flip-flop 820, using the complementary signal BUSYb of the busy signal BUSY as an input signal.

Figure 19:
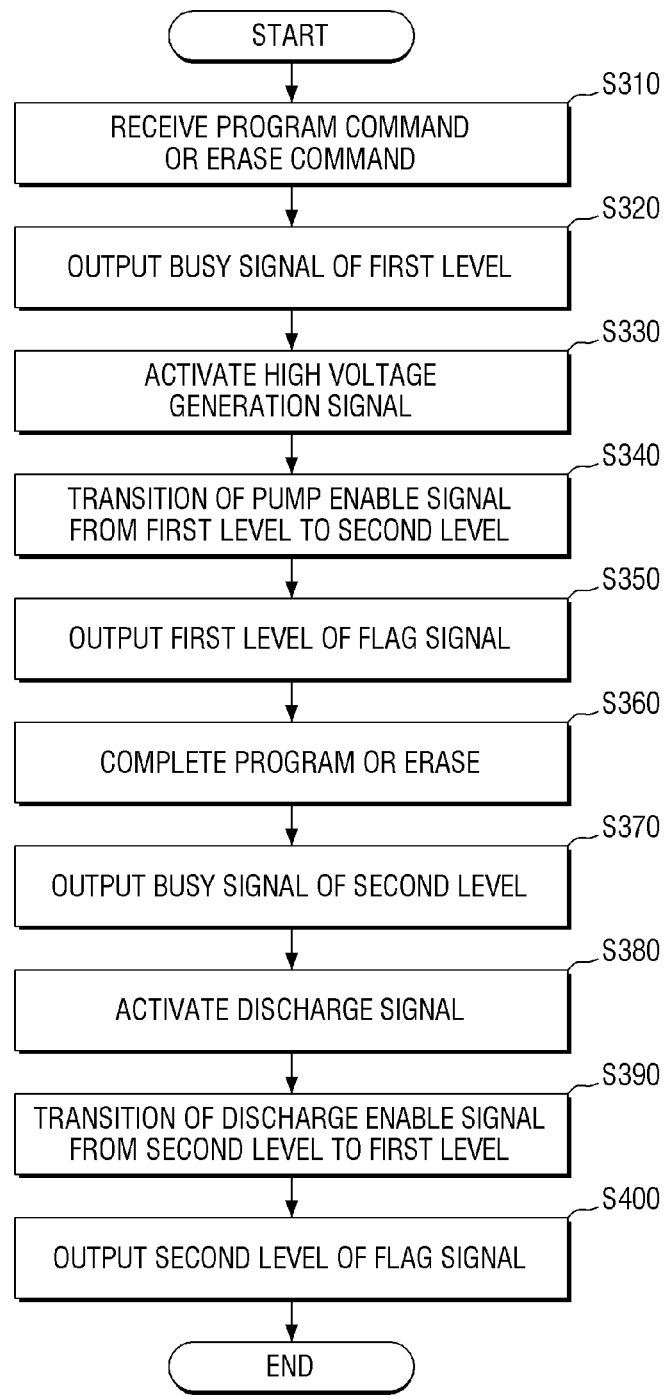
FIG. 19 illustrates a flowchart explanatory of the operation of the storage device according to some embodiments of the inventive concepts.
Figure 20:
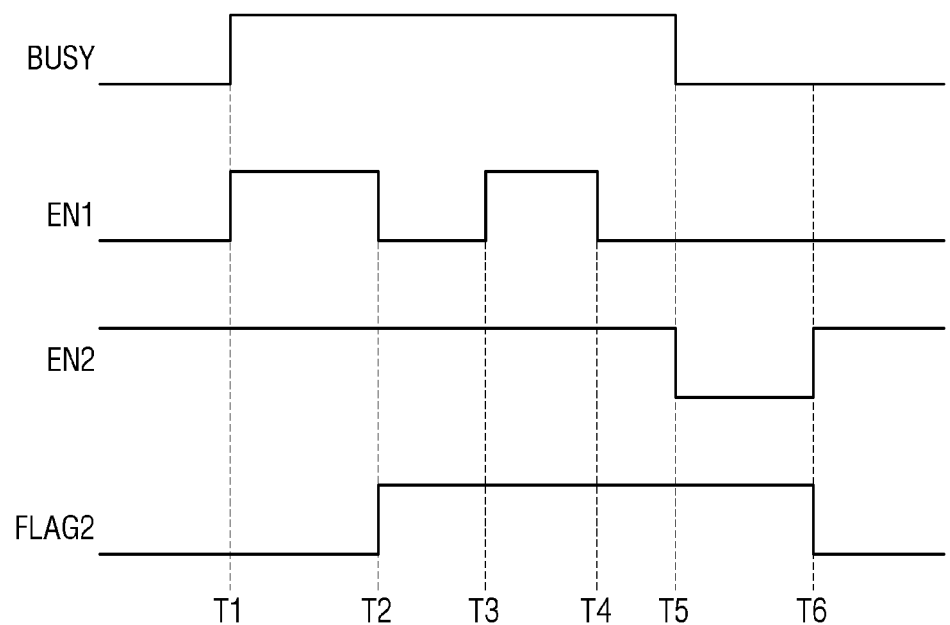
FIG. 20 illustrates a timing diagram explanatory of the operation of the storage device according to some embodiments of the inventive concepts.
Figure 21:
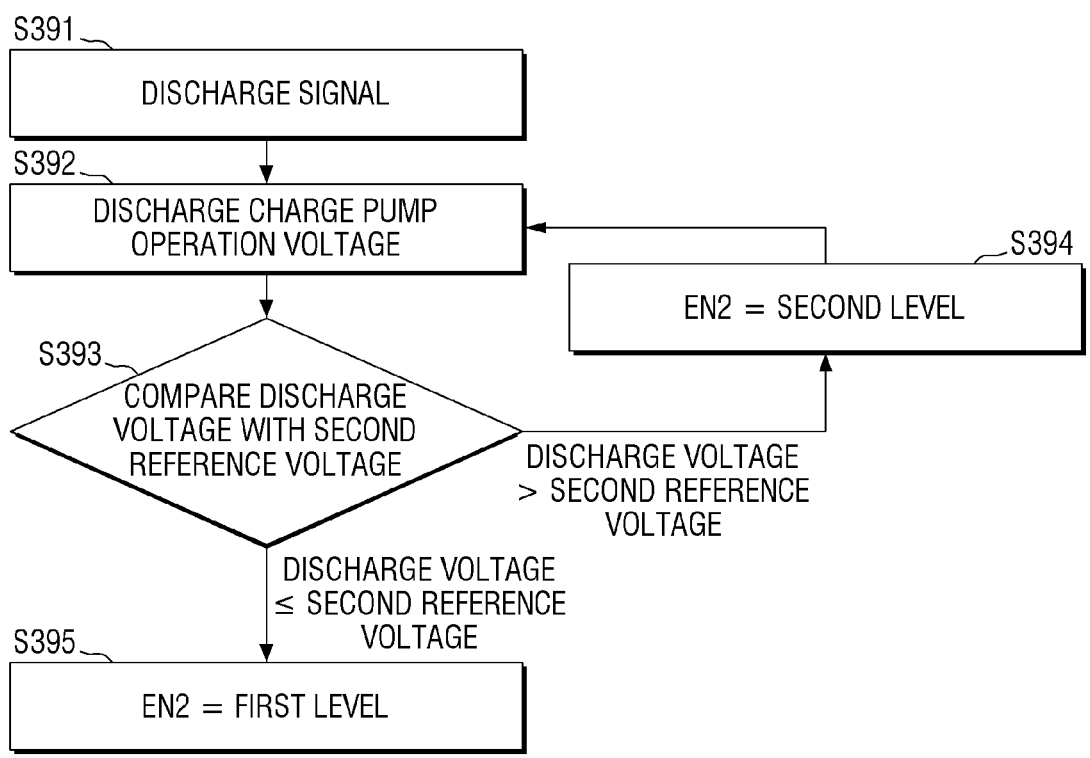
FIG. 21 illustrates a flowchart explanatory of the operation of the discharge circuit of the storage device according to some embodiments of the inventive concepts.
Figure 22:
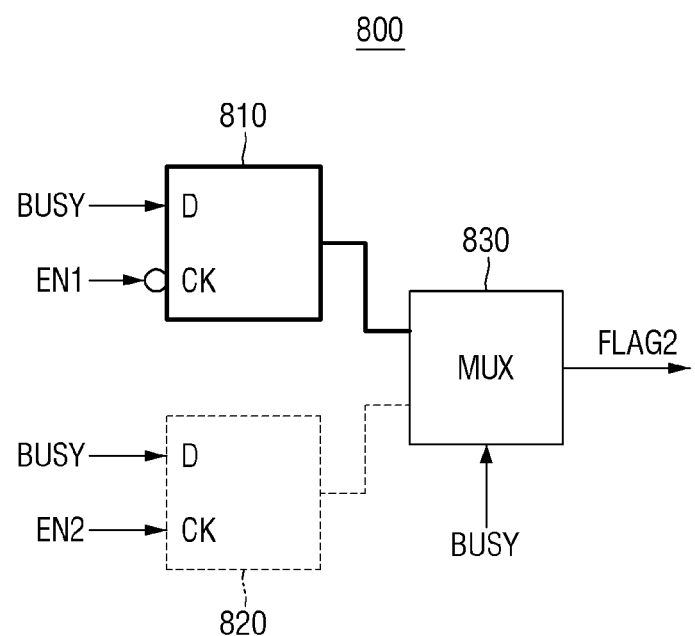
FIG. 22 illustrates a diagram explanatory of the operation of the flag generating circuit of the storage device according to some embodiments of the inventive concepts.
Figure 23:
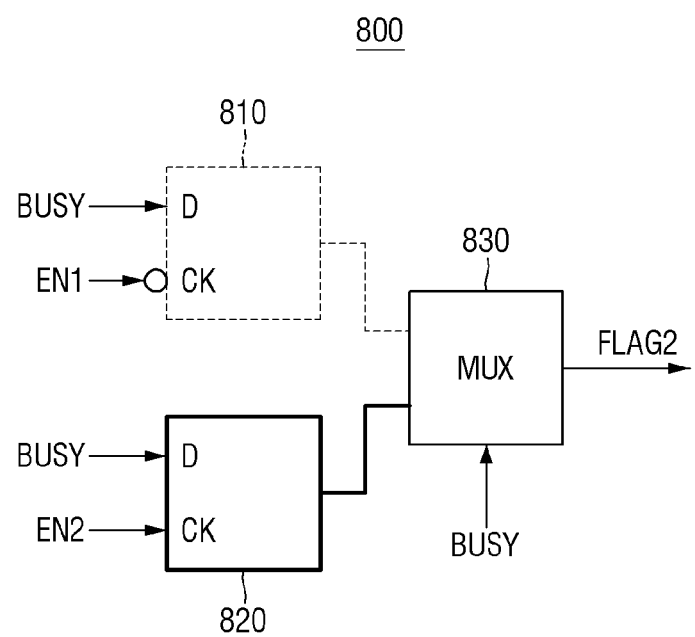
FIG. 23 illustrates a diagram explanatory of the operation of the flag generating circuit of the storage device according to some embodiments of the inventive concepts.

FIG. 19 illustrates a flowchart explanatory of the operation of the storage device 202 according to some embodiments of the inventive concepts. FIG. 20 illustrates a timing diagram explanatory of the operation of the storage device according to some embodiments of the inventive concepts. FIG. 21 illustrates a flowchart explanatory of the operation of the discharge circuit of the storage device according to some embodiments of the inventive concepts. FIGS. 22 and 23 illustrate diagrams explanatory of the operation of the flag generating circuit of the storage device according to some embodiments of the inventive concepts. For convenience of explanation, points different from those described referring to FIGS. 6, 7 and 9 to 11 will be mainly described.

Referring to FIG. 19, steps from S310 to S350 are the same as the steps from S110 to S150 described referring to FIG. 6. Accordingly, the operation of the storage device 202 from the first time T1 to the fourth time T4 of FIG. 20 is the same as the operation of the storage device 200 from the first time T1 to the fourth time T4 of FIG. 7 described above. Also, the operation of flag generating circuit 800 as shown in FIG. 22 is thus the same as the operation of flag generating circuit 400 described with respect to FIG. 10, so for convenience of explanation duplicate description of FIG. 22 is omitted.

Referring to FIGS. 15 and 19, when the storage device 202 completes the program or erase operation corresponding to the command CMD received from the processor 100 at step S360, the storage device 202 outputs the busy signal BUSY of the second level L at step S370.

For example, referring to FIG. 20, at the fifth time T5, the storage device 202 completes the program or erase operation and outputs the busy signal BUSY as having the second level L.

Referring to FIGS. 15 and 19 again, the control logic 221 activates the discharge signal DIS_SIG and transmits it to the discharge circuit 900 at step S380. At step S390, the discharge circuit 900 outputs the discharge enable signal EN2 as having the second level L in response to the discharge signal DIS_SIG received from the control logic 221, and when the high voltage $V_{HIGH}$ is discharged, the discharge circuit 900 outputs the discharge enable signal EN2 as having the first level H. The operation of the discharge circuit 900 of step S390 will be described in detail below referring to FIG. 21.

Referring to FIGS. 16 and 21, the discharge circuit 900 receives the discharge signal DIS_SIG from the control logic 221 at step S391. The discharge circuit 900 discharges the high voltage $V_{HIGH}$ received from the charge pump 610 to generate the discharge voltage $V_{ms}$ at step S392. The discharge circuit 900 compares the discharge voltage $V_{ms}$ with the second reference voltage Vref2 at step S393. At step S394, when the discharge voltage $V_{ms}$ is higher than the second reference voltage Vref2, the discharge circuit 900 outputs the discharge enable signal EN2 as having the second level L. At step S395, when the discharge voltage $V_{ms}$ is lower than or equal to the second reference voltage Vref2, the discharge circuit 900 outputs the discharge enable signal EN2 as having the first level H.

For example, referring to FIGS. 16 and 20, at the fifth time T5, the discharge circuit 900 outputs the discharge enable signal EN2 with the second level L in response to the discharge signal DIS_SIG received from the control logic 221. From the fifth time T5 before the sixth time T6, when the discharge voltage $V_{DIS}$ is higher than the second reference voltage Vref2, the discharge circuit 900 transmits the discharge enable signal EN2 as having the second level L. At the sixth time T6, when the discharge voltage $V_{DIS}$ is lower than or equal to the second reference voltage Vref2, the discharge circuit 900 outputs the discharge enable signal EN2 as having the first level H.

Referring to FIGS. 15 and 19 again, when the discharge enable signal EN2 transitions from the second level L to the first level H, the flag generating circuit 800 outputs the flag signal FLAG2 with the second level L in response to the transition at step S400. The operation of the flag generating circuit 800 of step S400 will be described in detail below referring to FIG. 23.

Referring to FIG. 23, when the busy signal BUSY is the second level L, the multiplexer 830 selects the output signal of the second flip-flop 820 and outputs it as the flag signal FLAG2. The second flip-flop 820 outputs the busy signal BUSY in response to the transition of the discharge enable signal EN2 from the second level L to the first level H. Although FIG. 23 shows that the multiplexer 830 selects the output signal of the second flip-flop 820 and outputs it as the flag signal FLAG2 when the busy signal BUSY is the second level L, embodiments are not limited thereto. For example, when the complementary signal BUSYb of the busy signal BUSY is the first level H, the multiplexer 830 may select the output signal of the second flip-flop 820 and output it as the flag signal FLAG2, using the complementary signal BUSYb of the busy signal BUSY as an input signal.

For example, referring to FIGS. 20 and 23, when the discharge enable signal EN2 transitions from the second level L to the first level H at the sixth time T6, the second flip-flop 820 outputs the busy signal BUSY, which is the second level L at the sixth time T6, in response to the transition. Further, since the busy signal BUSY is the second level L at the sixth time T6, the multiplexer 830 selects the busy signal BUSY of the second level L which is the output signal of the second flip-flop 820, and outputs it as the flag signal FLAG2. Therefore, the flag signal FLAG2 transitions from the first level H to the second level L at the sixth time T6.

Figure 24:
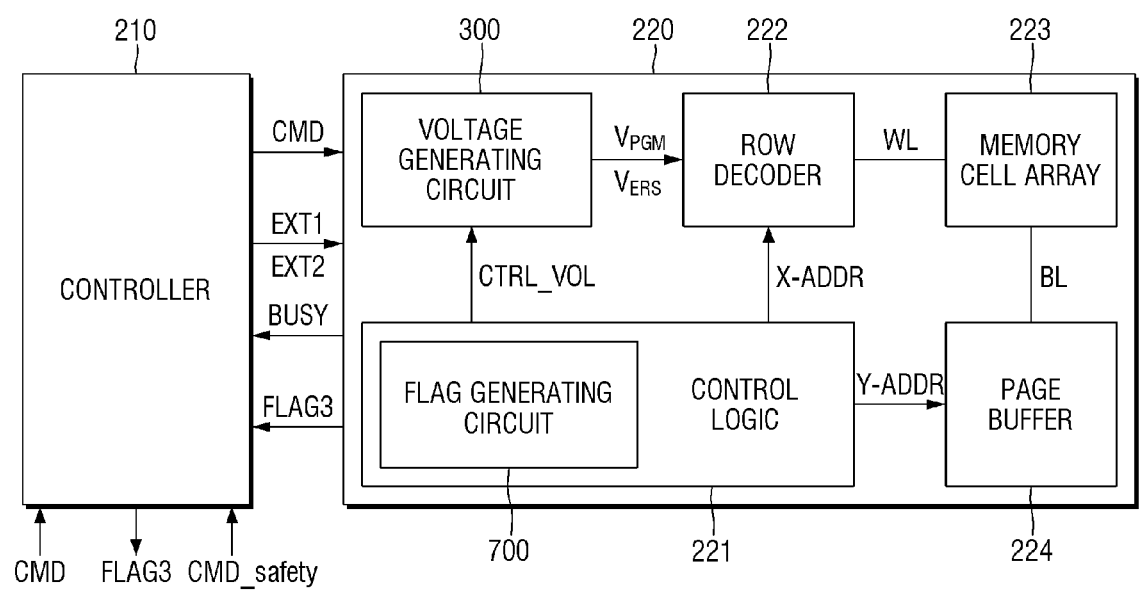
FIG. 24 illustrates a diagram of a storage device according to some embodiments of the inventive concepts.

FIG. 24 illustrates a diagram of a storage device 203 according to some embodiments of the inventive concepts. For convenience of explanation, points different from those described referring to FIG. 2 will be mainly described.

Referring to FIG. 24, the non-volatile memory device 220 may include a control logic 221, a row decoder 222, a memory cell array 223, a page buffer 224, a voltage generating circuit 300, and a flag generating circuit 700.

The flag generating circuit 700 may detect external signals EXT1 and EXT2 irrelevant to the command CMD received from the processor 100, and output a stop flag signal FLAG3, while the storage device 203 performs the operation corresponding to the command CMD received from the processor 100. In some embodiments, although the external signals EXT1 and EXT2 may be signals according to the command CMD which require an operation different from the operation performed by the storage device 203 in response to the command CMD received from the processor 100, embodiments are not limited thereto.

Although FIG. 24 shows that the flag generating circuit 700 is included in the control logic 221, embodiments are not limited thereto. In some other embodiments, the flag generating circuit 700 may be included in the controller 210 of the storage device 203. The flag generating circuit 700 will be described in detail below referring to FIG. 25.

Figure 25:
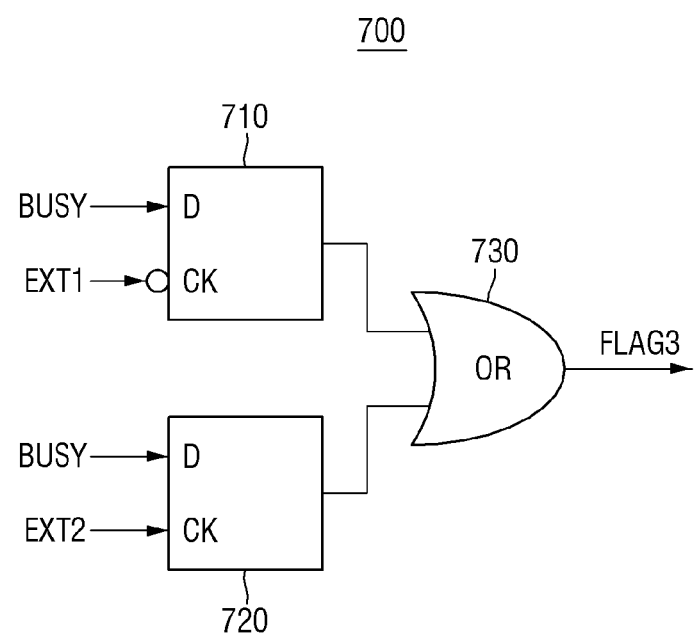
FIG. 25 illustrates a diagram of the flag generating circuit of FIG. 24.

FIG. 25 illustrates a diagram of the flag generating circuit of FIG. 24.

Referring to FIG. 25, the flag generating circuit 700 may include a first flip-flop 710, a second flip-flop 720, and an OR gate 730.

The first flip-flop 710 may output the busy signal BUSY on the basis of the first external signal EXT1. The first external signal EXT1 may be an external signal that has the first level H as a default value. The first flip-flop 710 is triggered at the edge in which the first external signal EXT1 changes from the first level H to the second level L, and may output the busy signal BUSY. In such a case, since the first flip-flop 710 is triggered at the time point when the first external signal EXT1 changes from the first level H to the second level L, the first flip-flop 710 is a falling edge flip-flop, but embodiments are not limited thereto.

For example, when the first flip-flop 710 outputs the busy signal BUSY on the basis of the complementary signal EXT1b of the first external signal EXT1, the first flip-flop 710 is triggered at the time point when the complementary signal EXT1b of the first external signal EXT1 changes from the second level L to the first level H, and may output the busy signal BUSY. In such a case, the first flip-flop 710 may be a rising edge flip-flop.

The second flip-flop 720 may output the busy signal BUSY on the basis of the second external signal EXT2. The second external signal EXT2 may be an external signal that has the second level L as a default value. The second flip-flop 720 is triggered at the edge in which the second external signal EXT2 changes from the second level L to the first level H, and may output the busy signal BUSY. In such a case, since the second flip-flop 720 is triggered at the time point when the second external signal EXT2 changes from the second level L to the first level H, the second flip-flop 720 is a rising edge flip-flop, but embodiments are not limited thereto.

For example, when the second flip-flop 720 outputs the busy signal BUSY on the basis of the complementary signal EXT2b of the second external signal EXT2, the second flip-flop 720 is triggered at the time point when the complementary signal EXT2b of the second external signal EXT2 changes from the first level H to the second level L, and may output the busy signal BUSY. In such a case, the second flip-flop 720 may be a falling edge flip-flop.

Although FIG. 25 shows the first flip-flop 710 and the second flip-flop 720 as a D flip-flop, embodiments of the inventive concepts are not limited thereto. For example, the first flip-flop 710 and the second flip-flop 720 may be SR flip-flops, JK flip-flops or T flip-flops.

The OR gate 730 has the output signal of the first flip-flop 710 and the output signal of the second flip-flop 720 as input signals, and when at least one of the input signals is the first level H, the OR gate 730 output the stop flag signal FLAGS of the first level H.

Figure 26:
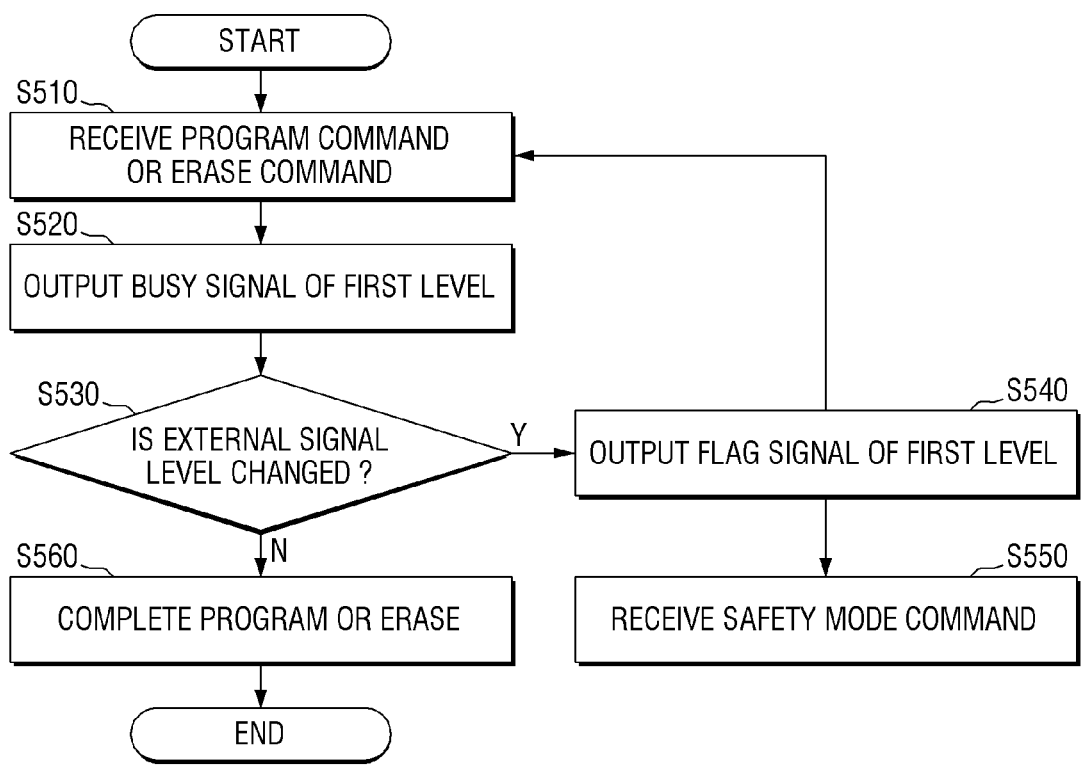
FIG. 26 illustrates a flowchart explanatory of the operation of the storage device according to some embodiments of the inventive concepts.
Figure 27:
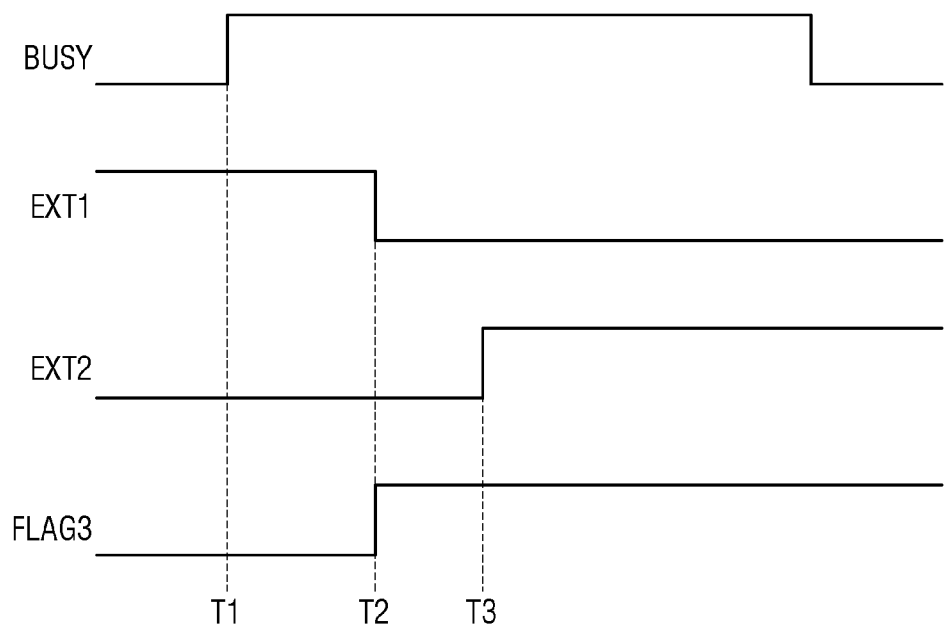
FIG. 27 illustrates a timing diagram explanatory of the operation of the storage device according to some embodiments of the inventive concepts.
Figure 28:
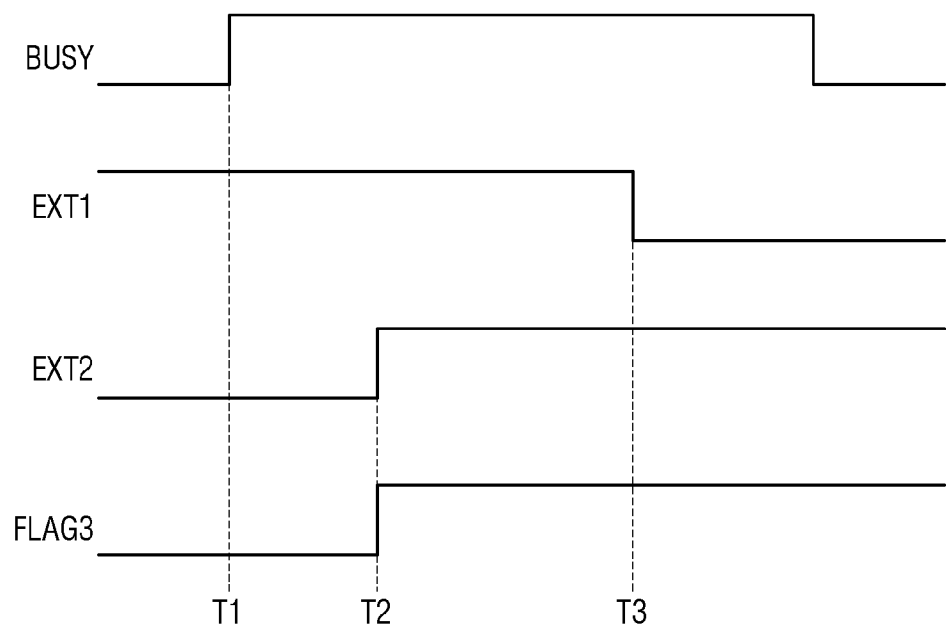
FIG. 28 illustrates a timing diagram explanatory of the operation of the storage device according to some embodiments of the inventive concepts.

FIG. 26 illustrates a flowchart explanatory of the operation of the storage device 203 according to some embodiments of the inventive concepts. FIGS. 27 and 28 illustrate timing diagrams explanatory of the operation of the storage device 203 according to some embodiments of the inventive concepts. For convenience of explanation, points different from those described referring to FIGS. 6 and 7 will be mainly described.

Referring to FIGS. 24 and 26, the storage device 203 receives a program or erase command CMD (i.e., a first command) from the processor 100 at step S510. At step S520, the storage device 203 outputs the busy signal BUSY as having the first level H, when the program or erase operation is started in response to the received program or erase command CMD.

For example, referring to FIG. 27, at the first time T1, the storage device 203 starts the program or erase operation in response to the program or erase command CMD from the processor 100, and outputs the busy signal BUSY as having the first level H.

Referring to FIGS. 24 and 26 again, at step S530, the flag generator 700 detects whether a level of an external signal according to a second command different from the program or erase command CMD is changed. When it is determined that the level of the external signal is changed at step S530, at step S540 the flag generating circuit 700 outputs the stop flag signal FLAG3 of the first level H. At step S550, the storage device 203 receives the safety mode command CMD_safety which stops the program operation or the erase operation. At step S560, the storage device 203 completes program or erase operations corresponding to the command CMD received from the processor 100 when it is determined at step S530 that the level of the external signal is not changed.

For example, referring to FIGS. 25 and 27, the flag generating circuit 700 may receive a first external signal EXT1 that transitions from the first level H to the second level L at the second time T2. When the first external signal EXT1 transitions from the first level H to the second level L at the second time T2, the first flip-flop 710 outputs the busy signal BUSY of the first level H at the second time T2 in response to the transition. Since the busy signal BUSY of the first level H output from the first flip-flop 710 is provided as an input signal to the OR gate 730, the OR gate 730 outputs the stop flag signal FLAG3 of the first level H at the second time T2.

The flag generating circuit 700 may receive the second external signal EXT2 that transitions from the second level L to the first level H at the third time T3. When the second external signal EXT2 transitions from the second level L to the first level H at the third time T3, the second flip-flop 720 outputs the busy signal BUSY of the first level H at the third time T3 in response to the transition. Since the busy signal BUSY of the first level H output from the second flip-flop 720 is provided as an input signal to the OR gate 730, the OR gate 730 outputs the stop flag signal FLAG3 of the first level H at the third time T3. Therefore, the stop flag signal FLAG3 is continuously output as having the first level H.

As another example, referring to FIGS. 25 and 28, at the second time T2, the flag generating circuit 700 receives the second external signal EXT2 that transitions from the second level L to the first level H. When the second external signal EXT2 transitions from the second level L to the first level H, the second flip-flop 720 outputs the busy signal BUSY as having the first level H at the second time T2 in response to the transition. Since the busy signal BUSY of the first level H output from the second flip-flop 720 is provided as an input signal to the OR gate 730, the OR gate 730 outputs the stop flag signal FLAG3 of the first level H at the second time T2.

At the third time T3, the flag generating circuit 700 receives the first external signal EXT1 that transitions from the first level H to the second level L. When the first external signal EXT1 transitions from the first level H to the second level L at the third time T3, the first flip-flop 710 outputs the busy signal BUSY, which is the first level H at the third time T3, in response to the transition. Since the busy signal BUSY of the first level H output from the first flip-flop 710 is provided as an input signal to the OR gate 730, the OR gate 730 outputs the stop flag signal FLAG3 of the first level H at the third time T3.

That is, when the stop flag signal FLAG3 transitions from the second level L to the first level H, it means that an external signal irrelevant to the operation is detected while the program operation or the erase operation is being performed. In some embodiments, when the stop flag signal FLAG3 is output as having the first level H, the processor 100 may transmit the command CMD to the storage device 203 again to perform the program or erase operations again. Also, in some embodiments, when the stop flag signal FLAG3 is output as having the first level H, the processor 100 may transmit the safety mode command CMD_safety which stops the program operation or the erase operation to the storage device 203. In this way, the processor 100 may check whether the storage device 203 performs the program operation or the erase operation according to the command CMD without any defect through (by monitoring) the stop flag signal FLAG3. Further, since the processor 100 transmits the program or erase command CMD or the safety mode command CMD_safety in accordance with the stop flag signal FLAG3, the storage device 203 may perform the program operation or the erase operation without any defect.

Figure 29:
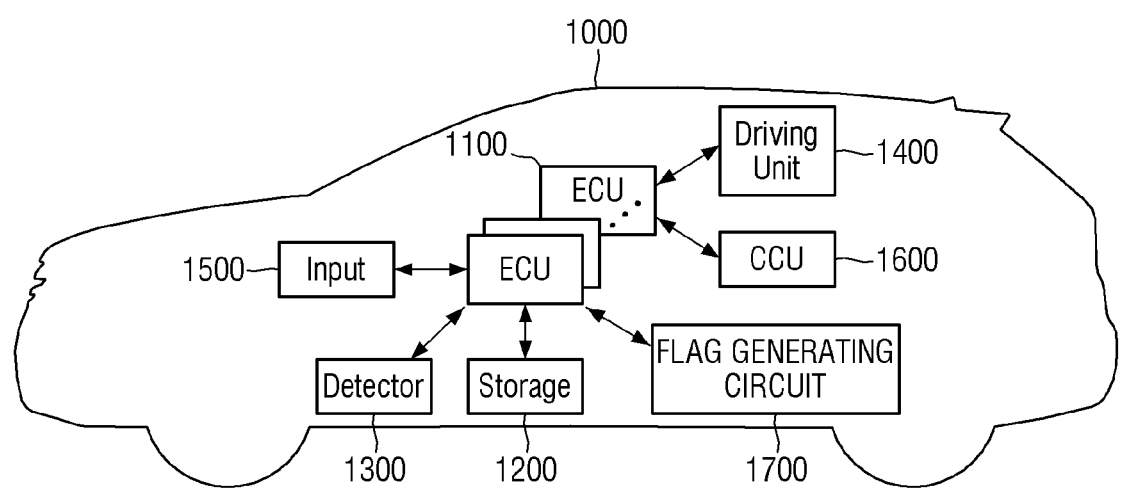
FIG. 29 illustrates a diagram of a vehicle including a storage device according to some embodiments of the inventive concepts.

FIG. 29 illustrates a diagram of a vehicle including a storage device according to some embodiments of the inventive concepts.

A vehicle 1000 may include a plurality of electronic control units (ECU) 1100 and a storage device 1200.

Each electronic control unit of the plurality of electronic control units 1100 is electrically, mechanically, and communicatively connected to at least one of a plurality of devices provided in the vehicle 1000, and may control operation of at least one device on the basis of any one function execution command.

Here, the plurality of devices may for example include an acquisition device (detector) 1300 that acquires information required to perform at least one function, and a driving unit 1400 that performs at least one function.

For example, the acquisition device 1300 may include various detectors and image acquisition units, and the driving unit 1400 may include a fan and a compressor of an air conditioner, a fan of a ventilator, an engine and a motor of a power unit, a motor of a steering device, a motor and a valve of a braking device, an opening and closing device of a door or a tailgate, and the like. For example, the input device 1500 may be an interactive display panel or control instrumentation through which the user may provide input/operational commands for controlling the driving unit 1400.

The plurality of electronic control units 1100 may communicate with the acquisition device 1300 and the driving unit 1400, for example, using at least one of Ethernet, low voltage differential signaling (LVDS) communication, and a LIN (Local Interconnect Network) communication.

The plurality of electronic control units 1100 determine whether it is necessary to perform a function on the basis of the information acquired through the acquisition device 1300 or through input device 1500, and when it is determined to perform the function, the plurality of electronic control units 1100 control the operation of the driving unit 1400 that performs the function, and may control an operating amount on the basis of acquired information. The plurality of electronic control units 1100 may store the acquired information in the storage device 1200, or may read and use information stored in the storage device 1200. The plurality of electronic control units 1100 receive the flag signal FLAG from the flag generating circuit 1700, and may check whether the storage device 1200 performs the operation according to the control of the plurality of electronic control units 1100 without any defect. Further, since the plurality of electronic control units 1100 transmit the operating command CMD (e.g., a program, erase or read command) or the safety mode command CMD_safety to the storage device 1200 in accordance with the flag signal FLAG, the storage device 1200 may perform the operation without any defect. Accordingly, it is possible to prevent an accident caused by an error in the storage device 1200 mounted on the vehicle 1000.

A connectivity control unit (CCU) 1600 is electrically, mechanically, and communicatively connected to each of the plurality of electronic control units 1100, and communicates with each of the plurality of electronic control units 1100.

That is, the connectivity control unit 1600 may directly communicate with a plurality of electronic control units 1100 provided inside the vehicle, may also communicate with an external server, and may also communicate with an external terminal through an interface.

Here, the connectivity control unit 1600 may communicate with the plurality of electronic control units 1100.

Further, the connectivity control unit 1600 may communicate with a server by wireless communication. Wireless communication between the connectivity control unit 1600 and the server is enabled through various wireless communication methods such as GSM (global System for Mobile Communication), CDMA (Code Division Multiple), WCDMA (Wideband Code Division Multiple Access), UMTS (universal mobile telecommunications system), TDMA (Time Division Multiple Access), and an Long Term Evolution (LTE™), in addition to a Wifi module and a WiBro (wireless broadband) module.

In concluding the detailed description, those skilled in the art should appreciate that many variations and modifications may be made to the embodiments without substantially departing from the inventive concepts. Therefore, embodiments disclosed should be considered in a generic and descriptive sense only and not for purposes of limitation.

What is claimed is:

1. A storage device comprising:
a non-volatile memory device configured to receive an operating command and perform an operation corresponding to the operating command;
a voltage generating circuit configured to generate an operating voltage according to the operating command, the voltage generating circuit including a charge pump configured to generate an operating voltage, an oscillator configured when enabled to drive the charge pump, and a regulator configured to regulate the operating voltage by applying a pump enable signal to selectively enable the oscillator, wherein the regulator is configured to output the pump enable signal as having a first level when the operating voltage is less than a first reference voltage and as having a second level when the operating voltage is equal to or higher than the first reference voltage; and
a flag generating circuit configured to receive a busy signal and the pump enable signal, the busy signal indicative of the non-volatile memory device performing the operation, and to output a flag signal based on the busy signal and the pump enable signal,
wherein the oscillator is enabled when the pump enable signal is at the first level and is not enabled when the pump enable signal is at the second level,
wherein the busy signal has the first level when the non-volatile memory device performs the operation, and the flag generating circuit is configured to transition the flag signal from the second level to the first level in response to the pump enable signal transitioning from the first level to the second level while the busy signal is at the first level, and to maintain the flag signal at the first level until the busy signal transitions from the first level to the second level.

2. The storage device of claim 1, wherein the oscillator is further configured when enable to discharge the charge pump, and the regulator is further configured to regulate the operating voltage by applying a pump discharge signal to selectively enable the oscillator to discharge the operating voltage, the flag generating circuit further receives the discharge enable signal that instructs discharge of the operating voltage, the flag generating circuit is further configured to control the flag signal in response to the busy signal and the discharge enable signal, the busy signal transitions from the first level to the second level when the non-volatile memory device completes the operation corresponding to the operating command, and the flag signal transitions from the first level to the second level in response to a change of the busy signal from the first level to the second level.

3. The storage device of claim 2, wherein the discharge enable signal maintains the first level when the operating voltage exceeds a second reference voltage, and transitions from the first level to the second level in response to the operating voltage becoming equal to or lower than the second reference voltage, and the operating voltage is equal to or lower than the second reference voltage at a time point when the flag signal transitions from the first level to the second level.

4. The storage device of claim 3, wherein the regulator is further configured to output the discharge enable signal as having the first level when the operating voltage is greater than the second reference voltage and as having the second level when the operating voltage is equal to or lower than the second reference voltage.

5. The storage device of claim 2, wherein the flag generating circuit comprises:

a first flip-flop configured to output the busy signal based on the pump enable signal;

a second flip-flop configured to output the discharge enable signal based on the busy signal; and a multiplexer configured to select one of an output of the first flip-flop and an output of the second flip-flop based on the busy signal.

6. The storage device of claim 5, wherein the first flip-flop is configured to output the busy signal in response to the transition of the pump enable signal from the first level to the second level, the second flip-flop is configured to output the discharge enable signal in response to the transition of level of the busy signal from the first level to the second level, and the multiplexer is configured to select and output the output of the first flip-flop as the flag signal when the busy signal is the first level, and select and output the output of the second flip-flop as the flag signal when the busy signal is the second level.

\* \* \* \* \*